United States Patent
Reynolds et al.

(10) Patent No.: US 7,584,448 B1
(45) Date of Patent: Sep. 1, 2009

(54) CONSTRUCTING A MODEL OF A PROGRAMMABLE LOGIC DEVICE

(75) Inventors: Bart Reynolds, Seattle, WA (US); Keith R. Bean, Greeley, CO (US); Daniel P. Kirkwood, Denver, CO (US); James F. Barei, Seattle, WA (US); Benjamin D. Ralston, Bellevue, WA (US)

(73) Assignee: Xilinx, Inc., San Jose, CA (US)

( * ) Notice: Subject to any disclaimer, the term of this patent is extended or adjusted under 35 U.S.C. 154(b) by 274 days.

(21) Appl. No.: 11/502,936

(22) Filed: Aug. 11, 2006

(51) Int. Cl.
G06F 17/50 (2006.01)

(52) U.S. Cl. .............................. 716/16; 716/12; 716/18

(58) Field of Classification Search ............. 716/16–18, 716/12
See application file for complete search history.

(56) References Cited

U.S. PATENT DOCUMENTS

| | | | |
|---|---|---|---|
| 5,128,871 A | 7/1992 | Schmitz | |
| 5,654,650 A | 8/1997 | Gissel | |
| 5,796,269 A | 8/1998 | New | |
| 5,886,538 A | 3/1999 | New | |
| 6,181,163 B1 | 1/2001 | Agrawal et al. | |
| 6,184,709 B1 | 2/2001 | New | |
| 6,297,666 B1 | 10/2001 | Weingartner et al. | |
| 6,346,824 B1 | 2/2002 | New | |
| 6,408,422 B1 | 6/2002 | Hwang et al. | |
| 6,584,601 B1 | 6/2003 | Kodosky et al. | |
| 6,608,638 B1 | 8/2003 | Kodosky et al. | |
| 6,691,301 B2 * | 2/2004 | Bowen ........................ 717/114 |
| 6,907,592 B1 | 6/2005 | Dante | |
| 6,975,137 B1 | 12/2005 | Schadt et al. | |
| 7,073,158 B2 * | 7/2006 | McCubbrey ................. 716/17 |
| 7,100,141 B1 * | 8/2006 | Ratchev et al. ................ 716/16 |
| 7,107,565 B1 * | 9/2006 | Lindholm et al. ............. 716/16 |
| 7,124,391 B1 * | 10/2006 | Patterson ..................... 716/17 |
| 7,149,997 B1 * | 12/2006 | Young et al. ................. 716/16 |
| 7,240,320 B1 * | 7/2007 | Trimberger et al. ........... 716/16 |
| 7,308,671 B1 * | 12/2007 | Yuan et al. ................... 716/16 |
| 7,337,100 B1 * | 2/2008 | Hutton et al. ................. 703/13 |

(Continued)

OTHER PUBLICATIONS

Xilinx, Inc.; U.S. Appl. No. 11/502,909 by Reynolds et al.; filed Aug. 11, 2006.

(Continued)

*Primary Examiner*—Stacy A Whitmore
(74) *Attorney, Agent, or Firm*—LeRoy D. Maunu; Lois D. Cartier

(57) ABSTRACT

A processor-implemented method is provided for constructing a model of a programmable logic device (PLD) design. A netlist is input that describes the PLD design. An identification is input of programmable tile modules that include a programmable resource, which is either programmable interconnect or programmable logic. A first characterization data is input for sub-modules of the programmable tile modules for the programmable resource. For each programmable tile module, the routing arcs of each programmable interconnect are generated. A second characterization data is input for a configuration memory cell module of the PLD design. A third characterization data is input for a configuration control module of the PLD design. A first map is generated that links each routing arc to a bit of configuration data for programming the programmable interconnect. A second map is generated that links each logic function to a bit of configuration data for programming the programmable logic.

20 Claims, 17 Drawing Sheets

U.S. PATENT DOCUMENTS

| | | | |
|---|---|---|---|
| 7,337,422 B1 * | 2/2008 | Becker et al. | 716/16 |
| 7,343,578 B1 * | 3/2008 | Patterson et al. | 716/16 |
| 7,376,929 B1 * | 5/2008 | Grant | 716/16 |
| 7,380,232 B1 * | 5/2008 | Schumacher et al. | 716/18 |
| 7,389,485 B1 | 6/2008 | Rahut et al. | |
| 2002/0161568 A1 * | 10/2002 | Sample et al. | 703/25 |
| 2003/0063605 A1 | 4/2003 | Ravi et al. | |
| 2004/0049759 A1 * | 3/2004 | Osann et al. | 716/16 |
| 2004/0060032 A1 * | 3/2004 | McCubbrey | 716/16 |
| 2004/0268286 A1 * | 12/2004 | New et al. | 716/14 |
| 2005/0204325 A1 * | 9/2005 | Fung et al. | 716/16 |
| 2005/0273750 A1 * | 12/2005 | Kaptanoglu | 716/16 |
| 2006/0001444 A1 * | 1/2006 | Chua et al. | 326/37 |
| 2006/0184912 A1 * | 8/2006 | Takano | 716/16 |
| 2006/0190903 A1 * | 8/2006 | Koo | 716/16 |
| 2006/0248493 A1 * | 11/2006 | Osann, Jr. | 716/16 |
| 2007/0164786 A1 | 7/2007 | Hecht | |

OTHER PUBLICATIONS

Xilinx, Inc.; U.S. Appl. No. 11/502,937 by Reynolds et al.; filed Aug. 11, 2006.

Xilinx, Inc.; U.S. Appl. No. 11/502,923 by Reynolds et al.; filed Aug. 11, 2006.

Xilinx, Inc.; U.S. Appl. No. 11/502,911 by Reynolds et al.; filed Aug. 11, 2006.

Xilinx, Inc.; U.S. Appl. No. 11/502,922 by Reynolds et al.; filed Aug. 11, 2006.

Xilinx, Inc.; U.S. Appl. No. 11/502,946 by Reynolds et al.; filed Aug. 11, 2006.

Healey, Steven T. et al.; "Abstract Routing of Logic Networks for Custom Module Generation"; 24$^{th}$ ACM/IEEE Design Automation Conference; Copyright 1987 ACM; paper 13.3; pp. 230-236.

OrCAD PSpice, "User's Guide"; 1998; OrCAD Inc.; pp. 129-146.

* cited by examiner

CONSTRUCTING A MODEL OF A PROGRAMMABLE LOGIC DEVICE

FIELD OF THE INVENTION

The present invention generally relates to programmable logic devices and more particularly to a model or representation of a programmable logic device.

BACKGROUND

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic resources. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these programmable logic devices (PLDs), the functionality of the device is controlled by data bits of configuration data provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable.

To implement a user design in a PLD, various software tools may generate corresponding configuration data and program the PLD with the configuration data. The configuration data may be generated by these software tools from a specification of the user design. These software tools may utilize models of various aspects of the circuitry of the PLD, and to correctly generate the configuration data for a user design, the models must accurately reflect the circuitry of the PLD.

The generation of models for a PLD may be time-consuming and expensive. The extraction of a model from the circuitry of the PLD may be done manually by inspection of the schematics of the PLD and certain associated information. Frequently, manual generation of models involves tracing of signal connections between various circuits of the PLD. Because the circuits and signals connections are numerous and may have similar names, the manual extraction of a model may be confusing and prone to error. In addition, circuit changes may be made quite late in the development of the PLD, and these circuit changes may affect the models for certain aspects of the circuitry of the PLD. After a circuit change, the availability of the models may be delayed by the time-consuming manual extraction process.

The present invention may address one or more of the above issues.

SUMMARY OF THE INVENTION

Various embodiments of the invention provide a processor-implemented method for constructing a model of a programmable logic device (PLD) design. A netlist is input that describes the PLD design. The netlist includes instances of modules with the modules including programmable tile modules and the instances including tile instances of the programmable tile modules. An identification is input of each of the programmable tile modules. Each programmable tile module includes at least one programmable resource, with each programmable resource being either a programmable interconnect resource configurable to implement a plurality of routing arcs or a programmable logic resource configurable to implement a plurality of logic functions. A first map is generated from the netlist that links each routing arc to at least one bit of configuration data for programming the programmable interconnect resources of the programmable tile modules. A second map is generated from the netlist that links each logic function to at least one bit of configuration data for programming the programmable logic resources of the programmable tile modules.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
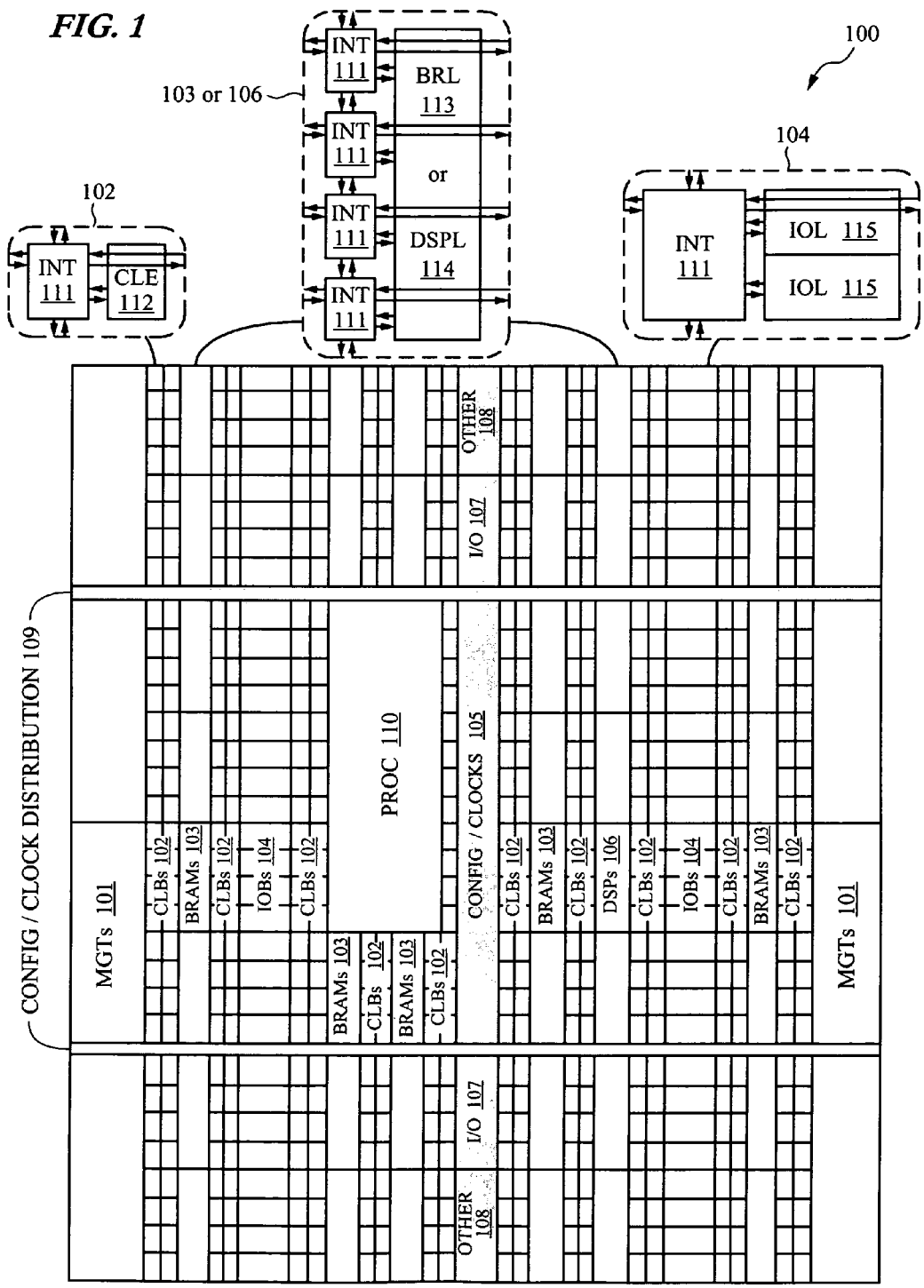
FIG. 1 is a block diagram of a programmable logic device (PLD) in accordance with various embodiments of the invention.

FIG. 1 is a block diagram of a programmable logic device (PLD) in accordance with various embodiments of the invention. FIG. 1 illustrates an FPGA architecture 100 for a PLD that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic.

Figure 2:
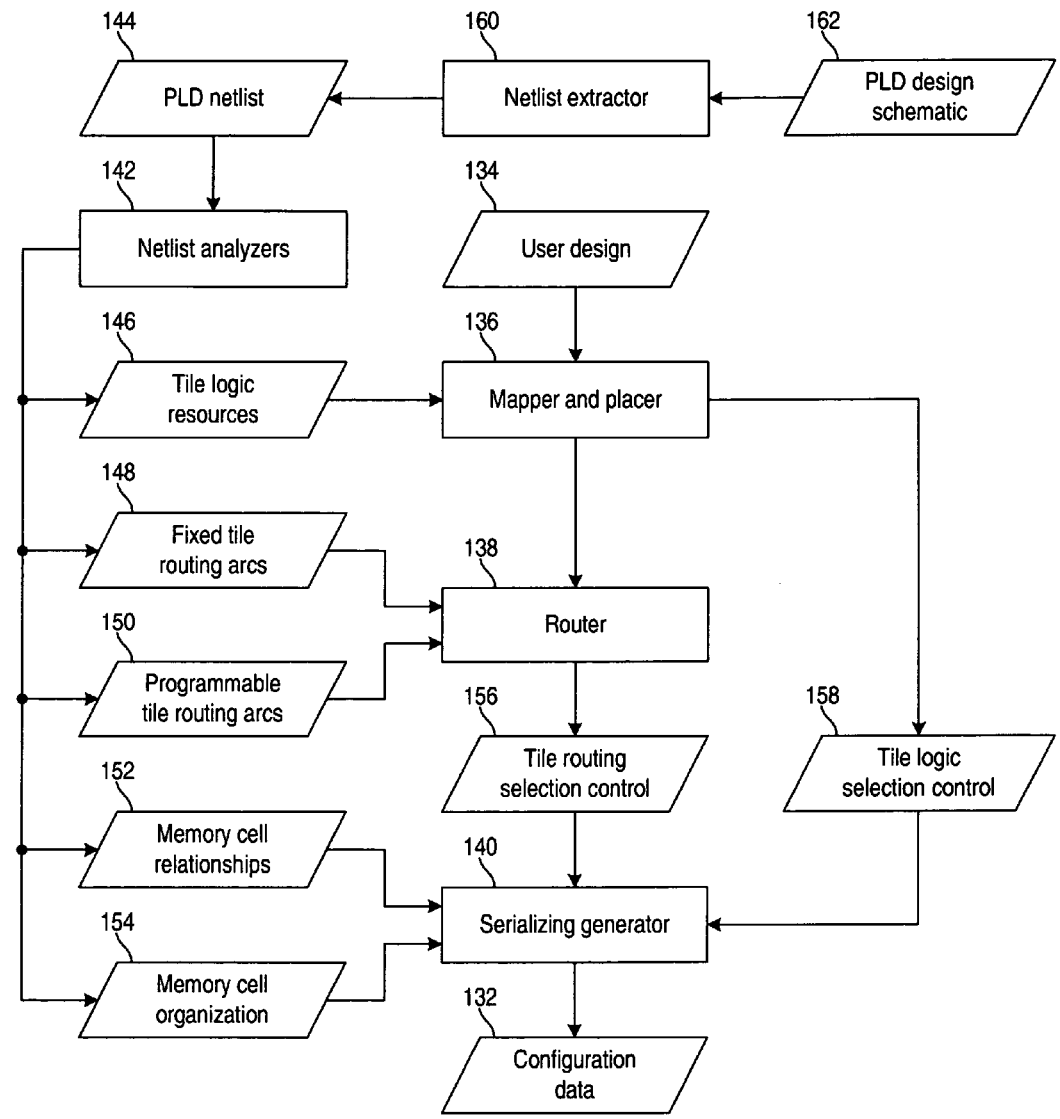
FIG. 2 is a data flow diagram of a process for generating configuration data for a user design in accordance with various embodiments of the invention.

FIG. 2 is a data flow diagram of a process for generating configuration data 132 for a user design 134 in accordance with various embodiments of the invention. The configuration data 132 may be generated from the user design 134 by translation tools including a mapper/placer 136, router 138, and serializing generator 140. Various embodiment of the invention create models of a PLD that are used by the translation tools to create configuration data 132 from a user design 134. The models may be generated by various analyzers 142 of a PLD netlist 144 specifying the design of the PLD. The models may include tile programmable-logic resources 146, fixed tile routing arcs 148, programmable tile routing arcs 150, memory cell relationships 152, and memory cell organization 154.

The user design 134 may be a specification of the user design in a hardware description language, such as Verilog or VHDL. The mapper/placer 136 may map the logic functions of the user design into the programmable logic resources 146 that are available in the PLD. The mapper/placer 136 may also place each mapped logic function of the user design into a specific tile instance of the PLD.

With the logic functions of the user design placed in the tile instances, the appropriate connections between the inputs and outputs of these placed logic functions are generated by the router 138. The router 138 may use arcs 148 and 150 of the fixed interconnect and the programmable interconnect resources to produce these connections. The programmable interconnect resources may include multiplexers that may each provide one of several programmable connections depending on which input is selected to drive the output of the multiplexer. The output of the router 138 may include the values of the selection controls 156 of the multiplexers of the programmable interconnect resources.

The mapper 136 may generate selection controls 158 that determine the logic functions implemented by the programmable logic resources. The combination of the selection controls 156 and 158 may determine the programming of the PLD that is required to implement the user design 134 in the PLD. The serializing generator 140 may put the values of the selection controls 156 and 158 into a particular order for the PLD to generate the configuration data 132. The particular order for the selection controls 156 and 158 may be specified by configuration memory cell relationships 152 and configuration memory cell organization 154.

The process of translating a user design 134 into configuration data 132 for a PLD may require certain models of the design of the PLD and these models of the PLD may be generated from a PLD netlist 144 according to various embodiments of the invention. In one embodiment, a netlist extractor 160 extracts the PLD netlist 144 from a schematic 162 of the design of the PLD.

Figure 3:
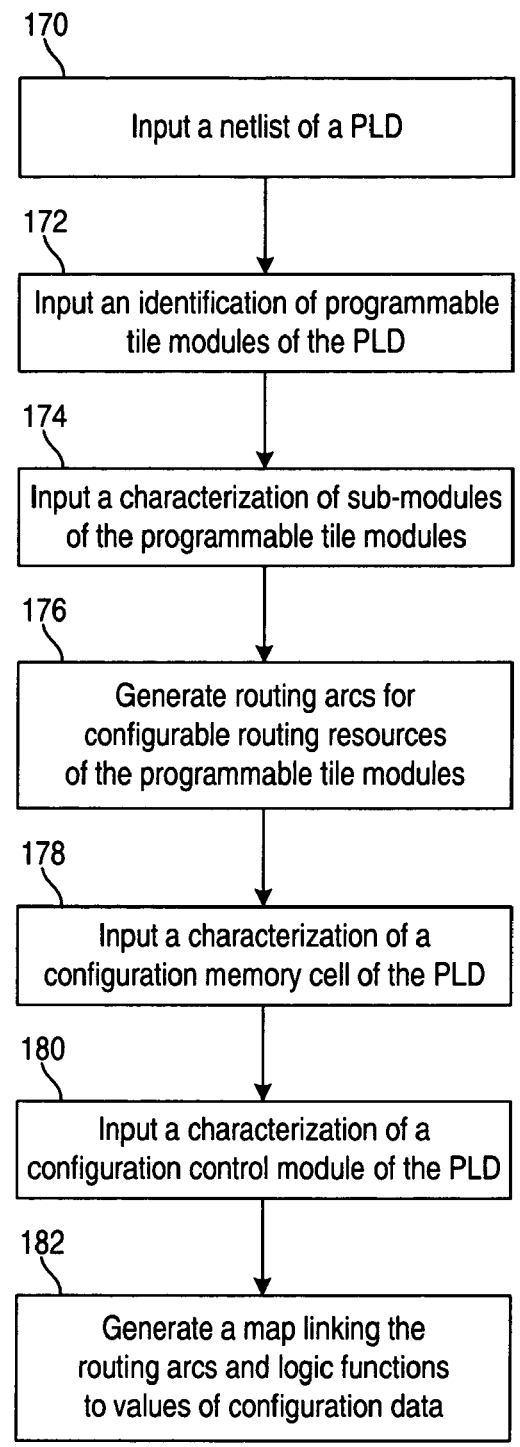
FIG. 3 is a flow diagram of a process for constructing models of a programmable logic device in accordance with various embodiments of the invention.

FIG. 3 is a flow diagram of a process for constructing models of a programmable logic device in accordance with various embodiments of the invention. The models may be generated from a netlist that specifies the design of the PLD.

At step 170, a netlist is input that specifies connections between instances of a modules, with the modules including programmable tile modules and the instances including tile instances of the programmable tile modules. At step 172, an identification of one or more of tile modules is input. At step 174, a characterization is input of one or more sub-modules of the programmable tile modules, and the characterization may specify certain sub-module characteristics. At step 176, routing arcs are generated for the programmable interconnect resources of the identified programmable tile modules. The routing arcs may be generated from the netlist that describes the PLD design using the characterization of step 174.

At step 178, a characterization is input for a configuration memory cell of the PLD, with each configuration memory cell being a module of the PLD. At step 180, a characterization is input for one or more configuration control modules of the PLD. The configuration control module or modules may be used to set the values of the instances of the configuration memory cell within the PLD. At step 182, a map is generated that links the routing arcs to values of configuration data for the programmable interconnect resources. The map also links logic functions of programmable logic resources of the programmable tile modules to other values of the configuration data for the programmable logic resources. The map may specify relationships between the instances of the configuration memory cells and the selection controls of the programmable logic and interconnect resources. The map may also specify an organization, which may be a two-dimensional organization, of the instances of the configuration memory cells.

Figure 4:
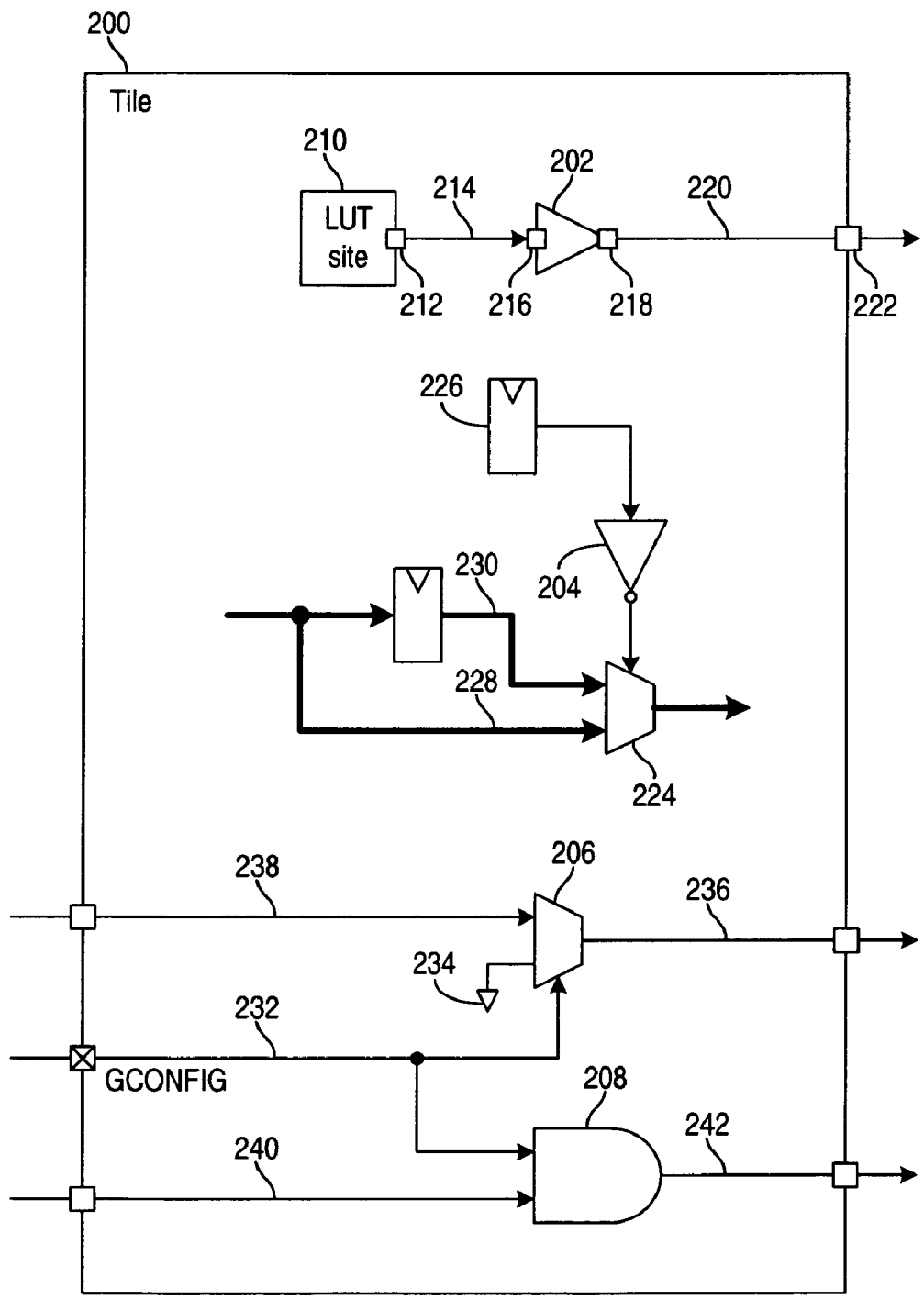
FIG. 4 is a block diagram of a programmable tile module of a programmable logic device illustrating repeaters in accordance with various embodiments of the invention.

FIG. 4 is a block diagram of a programmable tile module 200 of a programmable logic device (PLD) illustrating repeaters 202, 204, 206, and 208 in accordance with various embodiments of the invention. The programmable tile module 200 may be a CLB 102 as shown in FIG. 1 and a PLD may include multiple instances of the programmable tile module 200. The programmable tile module 200 may itself include instances, such as repeaters 202, 204, 206, and 208, of corresponding modules.

An internal source within tile 200, for example, look-up table 210, may have an output pin 212 that drives the network on line 214. Repeater 202 may be an instance of a module having the type of a buffer, and repeater 202 may have an input pin 216 receiving a value from the network on line 214 and an output pin 218 that drives this received value to the network on line 220. Because repeater 202 repeats the value received from input pin 216 at output pin 218, pins 216 and 218 are functionally equivalent pins that are functionally connected. For clarity, the input and output pins of repeaters 204, 206, and 208 are not explicitly shown.

Tile module 200 may have an output pin 222 connected to network 220, and the pins that are reachable from network 214 may include pin 222. The pins that are reachable from network 214 may also include pin 212 of look-up table 210 and pins 216 and 218 of repeater 202. Network 214 may be identified directly in one embodiment, and network 214 may be identified indirectly in another embodiment by identifying one of the pins, such as pin 212, of network 214.

The programmable resources of a PLD may include multiplexer 224 that is programmable by the value of memory configuration cell 226 to select either an input on line 228 or an input on line 230. The inputs 228 and 230 of multiplexer 224 may be buses containing multiple bits and multiplexer 224 may be an array of multiplexer gates having a common select input that is controlled by the value of memory configuration cell 226. An example usage for multiplexer 224 is for selecting either an asynchronous input on line 228 or a synchronous input on line 230 for the data input of a block RAM, such as block RAM 103 of FIG. 1. Because an example block RAM may have a data input with up to 36-bits, the multiplexer 224 may be an array of 36 multiplexer gates. An instance of the module for memory configuration cell 226 may have insufficient drive strength to directly drive the select input of 36 multiplexer gates, and repeater 204 may be included to increase the drive strength of memory configuration cell 226. Repeater 204 may be an inverting buffer that receives a logical value at the input using positive logic and repeats the logical value at the output using negative logic. Thus, while the repeater 204 may invert the electrical value, the repeater 204 might not invert the logical value.

A PLD may have a global configuration signal on line 232 that indicates that the PLD is initialized with configuration data that implements a user design in the programmable logic and interconnect resources of the PLD. Prior to completion of the programming of the PLD with the configuration data, the global configuration signal on line 232 may force certain signals to a specific value. For example, the global configuration signal on line 232 may cause repeater 206 to drive the value of zero from tie-down 234 to the output on line 236 prior to the completion of programming.

During normal operation of the user design in the PLD, the global configuration signal on line 232 may have a static value that causes repeater 206 to drive the value received on line 238 onto line 236 and causes repeater 208 to drive the value received on line 240 onto line 242. Thus, the input pin of repeater 206 for the network on line 238 may be functionally connected to the output pin of repeater 206 for the network on line 236, and the input pin of repeater 208 for the network on line 240 may be functionally connected to the output pin of repeater 208 for the network on line 242. The type for the repeater 206 may be a multiplexer gate and the type for the repeater 208 may be an AND gate.

Figure 5:
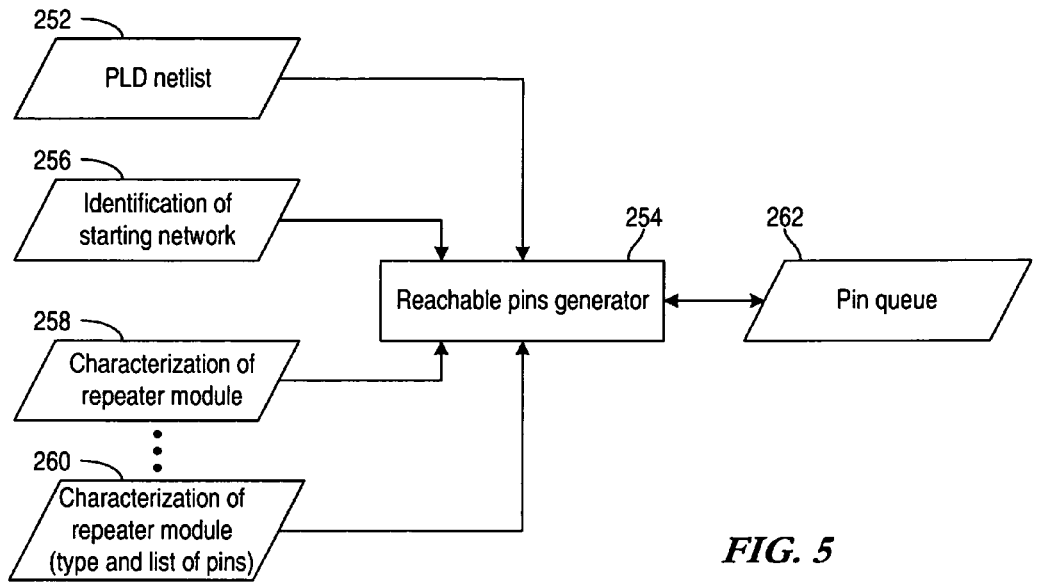
FIG. 5 is a data flow diagram of a process for determining pins that are reachable from a starting network in accordance with various embodiments of the invention.

FIG. 5 is a data flow diagram of a process for determining pins that are reachable from a starting network in accordance with various embodiments of the invention. The design of a PLD may be specified by a list of networks, PLD "netlist" 252, which may specify the connections between the instances of the modules of the PLD. The PLD netlist 252 may be searched by the generator 254 to determine the pins that a reachable from the starting network.

The identification 256 may identify a network from the netlist 252 as the starting network from which to begin the search. The starting network may be identified by a name of the starting network or by a node for the starting network in a graph representing the PLD netlist 252. A pin of an instance of a module that is connected to the starting network may also be used to identify the starting network.

Each of the characterizations 258 and 260 for the repeater modules may include a type of a repeater module and a set of functionally connected pins of the repeater module. An example characterization 258 for the repeater 202 of FIG. 4 may include the type of a buffer and the set of functionally connected pins that includes pins 216 and 218. The type for the repeater module may be a name from a module definition of the repeater module that is found in the PLD netlist 252, and the functionally connected pins may determine the pins that are functionally equivalent for each instance of the repeater module.

The reachable pins generator 254 may search the PLD netlist 252 for pins that are functionally equivalent to the pins of the starting network from identification 256. The reachable pins generator 254 may use pin queue 262 to track the reached pins. The pins in the pin queue 262 after finishing the search of the PLD netlist 252 may be the reachable pins that are functionally connected to the starting network.

Figure 6:
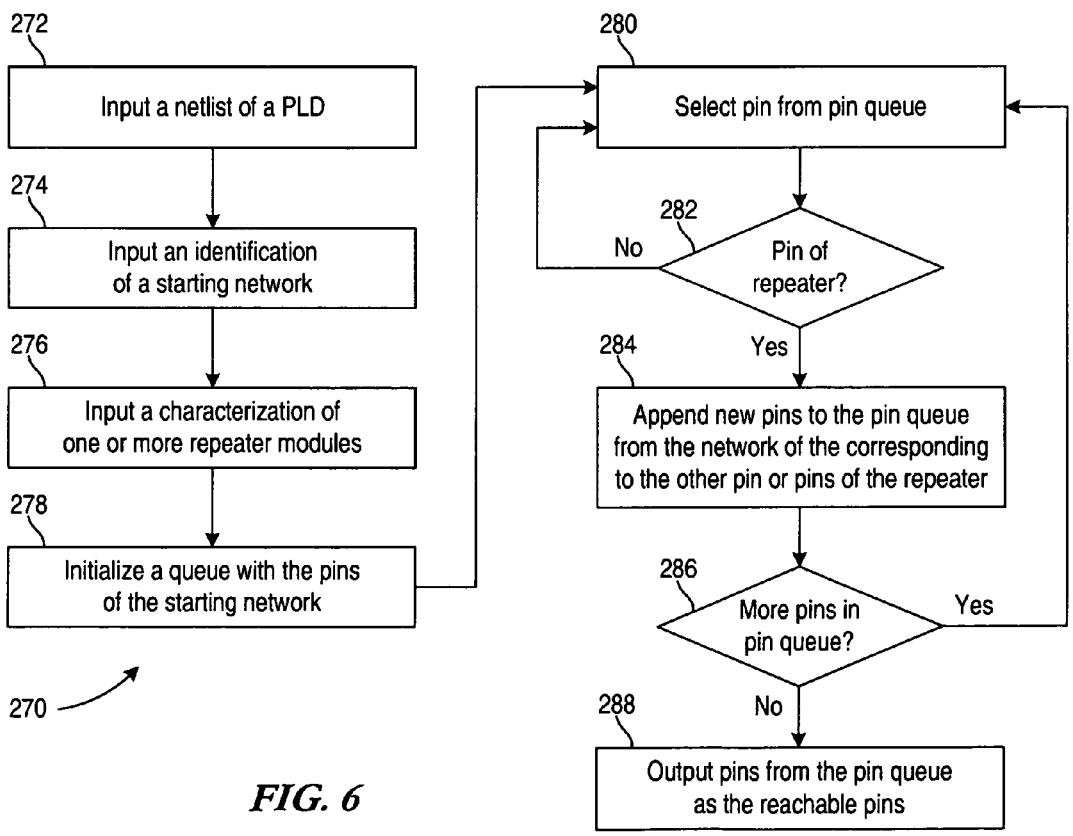
FIG. 6 is a flow diagram of a process for determining pins that are reachable from a starting network in accordance with various embodiments of the invention.

FIG. 6 is a flow diagram of a process 270 for determining pins that are reachable from a starting network in accordance with various embodiments of the invention. The PLD may be specified by a designer using a hardware description language and a PLD netlist may be generated from this specification of the PLD.

At step 272, the PLD netlist is input, with each network listed in the PLD netlist including a network name and a list of the pins of instances of the modules of the PLD that are connected by the network. The PLD netlist may be a flattened netlist having networks that interconnect pins of instances of elementary modules that do not contain any instances, or the PLD netlist may be a hierarchical netlist having networks that interconnect pins of a hierarchy of instances of modules.

At step 274, an identification of a starting network is input and the starting network may be identified directly or the starting network may be identified indirectly by identifying a pin that is included in the starting network. At step 276, a characterization of one or more repeater modules is input including a type of the repeater module and a set of functionally connected pins of the repeater module. In one embodiment, the PLD netlist is generated from a specification of the PLD in a hardware description language (HDL), and the characterization for a repeater module is an abbreviation or annotation of the specification of the repeater module from the HDL specification of the PLD. For example, the characterization for the repeater module may include the name of the repeater module and an abbreviated port list of the repeater module that only includes the ports of the repeater module that are functionally connected by the repeater module.

At step 278, the starting network may be found in the PLD netlist and the corresponding list of pins from the PLD netlist may be used to initialize a queue. At step 280, a pin in the queue is selected. Decision 282 checks whether the pin is one of the functionally connected pins of a repeater module. When the pin is not one of the functionally connected pins of a repeater module, process 270 returns to step 280 and the next pin from the queue is selected; otherwise, process 270 proceeds to step 284. At step 284, the corresponding network is found in the PLD netlist for each of the functionally connected pins of the pin selected at step 280, and each pin of each of these corresponding networks is appended to the queue, excluding those pins that are already in the queue. In one embodiment, a "visited" flag is maintained for each pin such that the queue does not need to be searched to determine whether a particular pin is already in the queue.

Decision 286 checks whether every pin in the queue has been considered. When the queue includes as yet unprocessed pins, process 270 returns to step 280 and another pin is selected from the queue; otherwise, process 270 proceeds to step 288. At step 288 the pins from the queue are output as the reachable pins that are functionally connected to the starting network.

Figure 7:
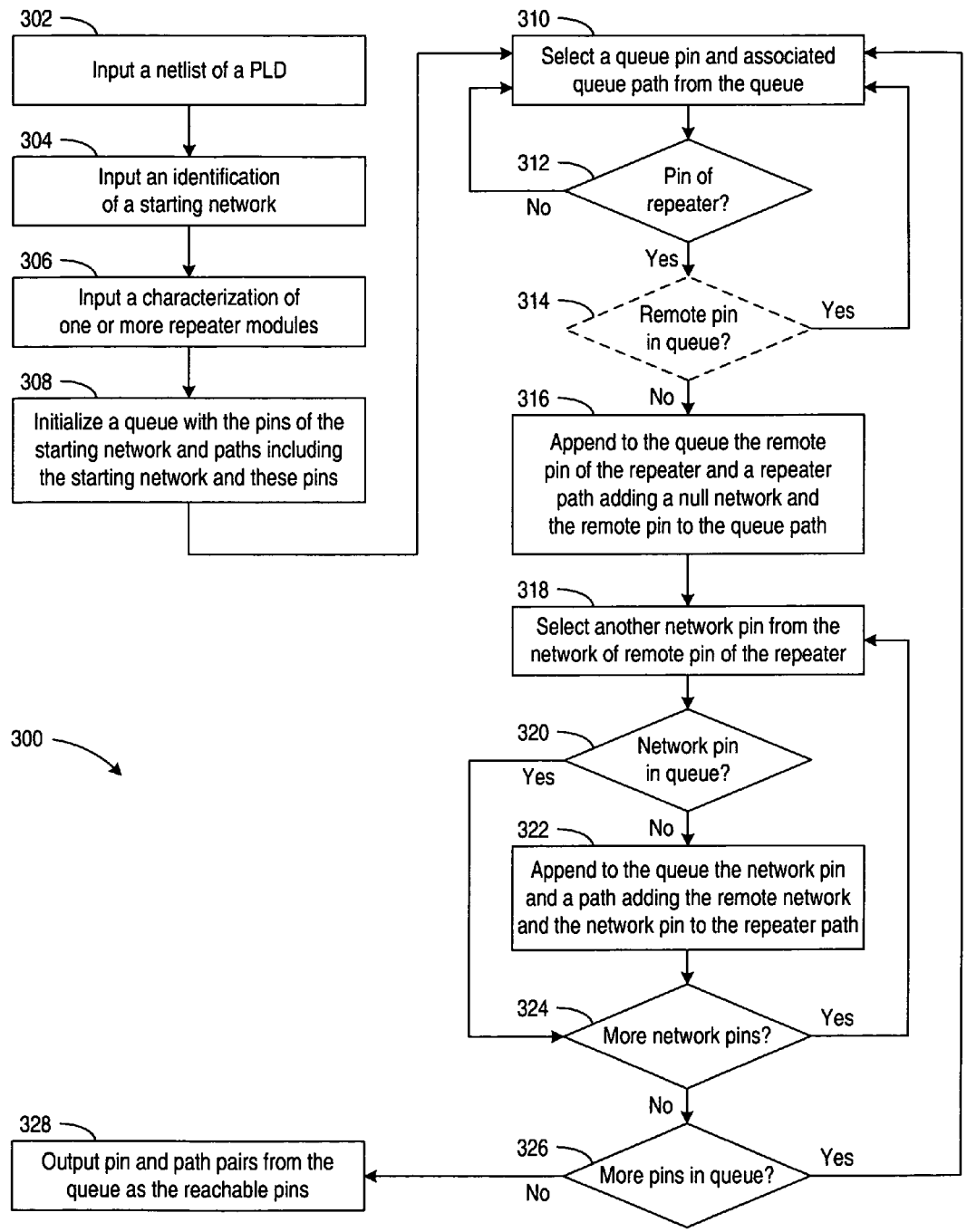
FIG. 7 is a flow diagram of a process for determining a queue of reachable pins in accordance with various embodiments of the invention.

FIG. 7 is a flow diagram of a process 300 for determining a queue of reachable pins in accordance with various embodiments of the invention. The reachable pins from the queue at the end of process 300 are a set of pins that are functionally connected to a starting network.

A netlist is input that specifies the networks of a PLD at step 302 and an identification is input that identifies the starting network at step 304. At step 306, a characterization of a repeater module is input that specifies the type of the repeater module and a set of functionally connected pins of the repeater module. Frequently, a repeater module has the set of functionally connected pins that includes one input pin and one output pin that repeats the value of the input pin. It will be appreciated that process 300 may be modified to handle a repeater module that has an alternative set of functionally connected pins, such as one input pin and multiple output pins.

A queue is initialized at step 308 with the pins of the starting network and a path for each pin. The pins of the starting network may be the pins that are specified in the netlist for the starting network. The queue may be organized as a list of pairs with each pair including a pin and a path from the starting network to the pin. Because the queue is initialized with the pins of the starting network, the path from the starting network to a pin in the queue at step 308 is a path including the starting network and the pin.

At step 310, a pin and the associated path are selected from the queue. The queue may be a FIFO of pairs and the pin and associated path may be obtained from the next pair in the FIFO. In one embodiment, a pair from the FIFO may be selected at step 310 without removing the pair from the FIFO. For example, the FIFO may be a list of pairs having a pointer to the pair that is selected at step 310 and following the selection of a pair at step 310 the pointer may move to the next pair in the queue. In another embodiment, the selection of a pair at step 310 may remove the pair from the FIFO and the removed pair may be saved in separate data structure. It will be appreciated that the queue may include the FIFO and this separate data structure.

Decision 312 checks whether the pin selected at step 310 is a pin of the set of functionally connected pins of a repeater module. Process 300 may proceed to optional decision 314 when the pin is such a pin of a repeater; otherwise, process 300 may return to step 310 for selection of the next pin in the queue. For a netlist having more than one path between the starting network and a reachable pin, optional decision 314 may ensure that the queue does not include more than one path between the starting network and any pin, as may be required in certain applications. For other applications, either the netlist does not include multiple paths or the queue is permitted or required include all paths between the starting network and the reachable pins. If optional decision 314 is included in process 300, process 300 returns to step 310 when the appropriate set of functionally connected pins of the repeater module includes the pin selected at step 310 and a remote pin that is already included in the queue; otherwise, process 300 proceeds to step 316.

At step 316, the queue is updated to append a pair of the remote pin of the repeater module and a corresponding repeater path. When the pin selected at step 310 is an input pin from the set of functionally connected pins of a repeater module, the remote pin may be an output pin of the repeater module. Similarly, when the pin selected at step 310 is an output pin from the set of functionally connected pins of a repeater module, the remote pin may be an input pin of the repeater module. In certain embodiments, a path between the starting network and a pin may be formatted as a sequence that alternates networks and pins, for example, starting network, first pin, second network, second pin, third network, third pin, and et cetera. To retain the alternating format of networks and pins, the corresponding repeater path for the remote pin of the repeater module may add a null network and the remote pin to the path for the pin selected at step 310.

The netlist may specify that the remote pin of the repeater module is connected to a network that may be denoted the remote network. The remote network generally includes the remote pin and one or more additional pins of the remote network. At step 318, one of these additional pins of the remote network is selected and decision 320 checks whether this additional pin is already included in the queue. Step 322 is skipped for an additional pin that is already in the queue. At step 322, the queue is updated to append a pair of the additional pin and a corresponding path that adds the remote network and the additional pin to the repeater path generated at step 316. After all of the additional pins of the remote network have been sequentially selected at step 318, process 300 proceeds from decision 324 to decision 326, and otherwise process 300 returns to step 318 for the selection of the next one of these additional pins of the remote network.

Decision 326 checks whether all of the pins of the pairs of the queue are processed. If the queue includes as yet unprocessed pairs, process 300 returns to step 310 for the selection of the next pin and associated path from the queue; otherwise, process 300 proceeds to step 328. Upon returning to step 310 for the selection of the next pin and associated path, the pin and associated path that are selected may be a pin and associated path previously appended to the queue at step 322. After the search of the netlist is completed, the pairs are output with each pair including a reachable pin and a path from the starting network to the reachable pin.

Example 1 shows pseudo-code for determining a queue of reachable pins according to one embodiment of the invention.

Example 1:

```
Initialize a queue to empty.
Initialize a set of reachable pins to empty.
If the starting point is specified using a starting pin instead of a starting
network {
    Set the starting network to the network of the starting pin.
}
For each pin of the starting network {
    Set a path to the starting network and the pin.
    Add the pin and the path to the queue and the set of reachable pins.
}
While the queue is not empty {
    Pop the current pin and corresponding current path from the queue.
    If the current pin is in the set of functionally connected pins of a
    repeater module {
        Set a remote pin to the other pin of the set of functionally
        connected pins.
        Set a remote path to the current path plus the null network and the
        remote pin.
        For each pin of the remote network of the remote pin {
            If the pin is not already in the set of reachable pins {
                Set a path to the remote path plus the remote network and the
                pin.
                Add the pin and the path to the queue and the set of reachable
                pins.
            }
        }
    }
}
```

Figure 8:
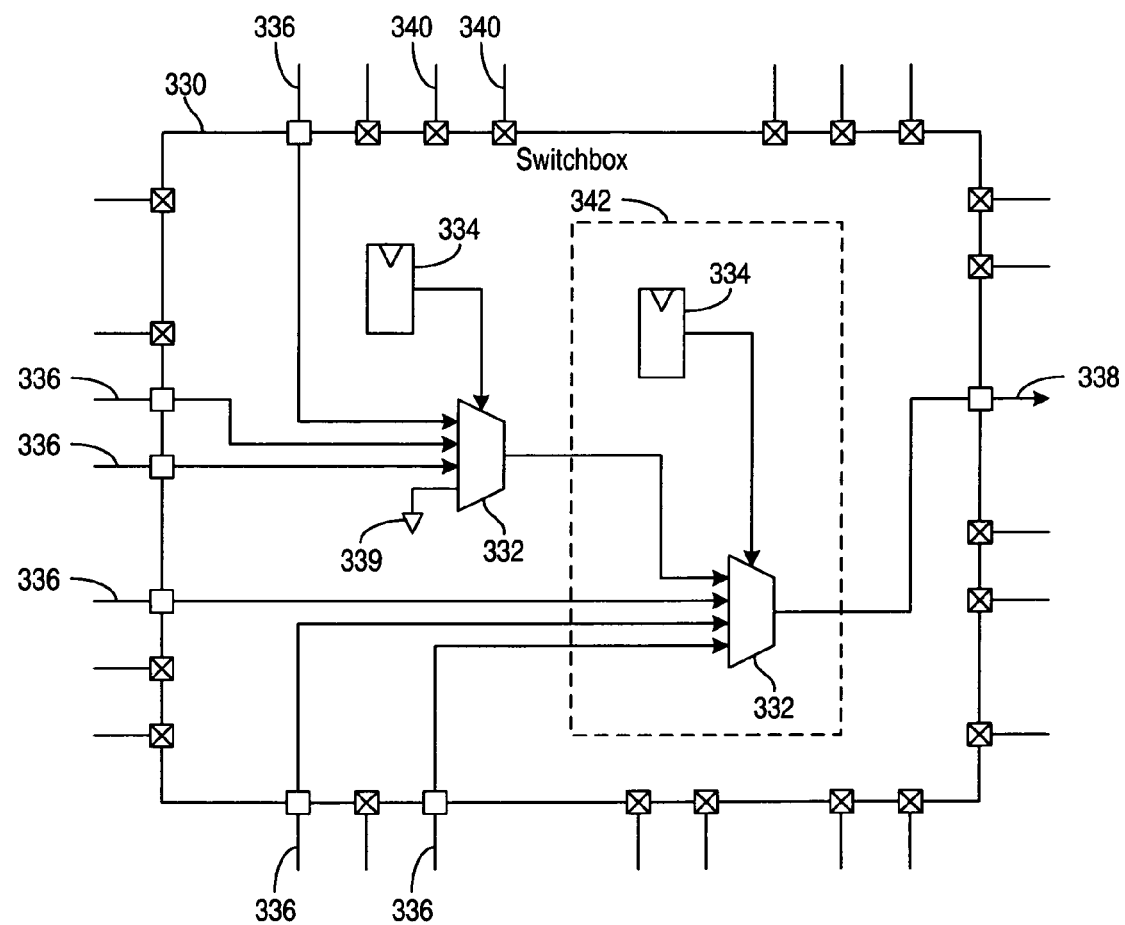
FIG. 8 is a block diagram of a programmable switchbox of a programmable logic device in accordance with various embodiments of the invention.

FIG. 8 is a block diagram of a programmable switchbox 330 of a programmable logic device in accordance with various embodiments of the invention. The programmable switchbox 330 may include programmable multiplexers 332 that are programmed to implement a portion of the programmable interconnect of the PLD. The programmable selection of the multiplexers 332 may be controlled by the value of configuration memory cells 334. Programmable switchbox 330 may correspond, for example, to programmable interconnect element (INT 111) of FIG. 1.

Various embodiments of the invention automatically determine the various programmable connections that might be made by the switchbox 330. The programmable connections may be described using arcs from certain input pins 336 and tie-down zero and one values to certain output pins including pin 338. For the appropriate programming of configuration memory cells 334, any one of the input pins 336 may be coupled to the output pin 338. In addition, the zero value from tie-down 339 may be coupled to the output pin 338. Thus, the programmable connections that are provided by switchbox 330 may be specified by a respective arc from each of the input pins 336 and from a zero value for tie-down 339 to the output pin 338. The specification of each arc from one of the input pins 336 or from a zero or one tie-down to the output pin 338 may include a specification of the series of multiplexers that may be programmed to provide the programmable connection. The specification of each arc may also include a specification of the pins of each multiplexer that are used to provide the programmable connection.

It will be appreciated that a switchbox 330 may include pins 340 that are not used for making programmable connections. For example, a switchbox 330 may be specified by a schematic that includes circuitry for power distribution, testing, and configuration, including programming of configuration memory cells 334. Generally, pins 340 are not included in the model of the switchbox that is generated by various embodiments of the invention.

While a PLD may include many multiplexers that are not used to make programmable connections, frequently all of the multiplexers that are used to make programmable connections are collected together into switchboxes. Thus, all of multiplexers 334 or certain specified multiplexers within switchbox 330 may be used to make programmable connections. A switchbox 330 may include hierarchy, such as instance 342 of a sub-module and other levels of hierarchy, and multiplexers 332 may be considered internal to switchbox 330 regardless of whether each multiplexer is included directly within the switchbox 330 or within the hierarchy of the switchbox 330.

Figure 9:
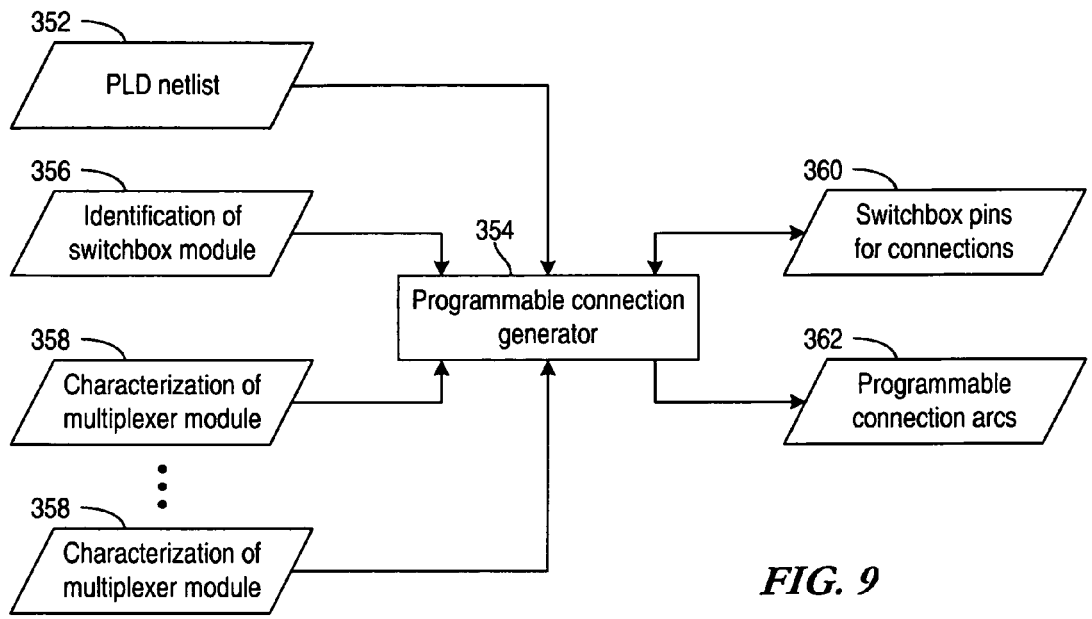
FIG. 9 is a data flow diagram of a process for determining programmable connections through a switchbox of a programmable logic device in accordance with various embodiments of the invention.

FIG. 9 is a data flow diagram of a process for determining programmable connections through a switchbox of a programmable logic device in accordance with various embodiments of the invention. The design of a PLD may be specified by a PLD netlist 352 that is searched by programmable connection generator 354 to determine the programmable connections of a switchbox that is identified by identification 356. The identification 356 of the switchbox module may be a name from a module definition for the switchbox from a hardware description language specification of the PLD. Because the PLD netlist 352 may be generated from the hardware description language specification of the PLD, the netlist 352 may include the name for the switchbox as the type for the switchbox.

The switchbox may include instances of one or more types of multiplexer modules and these instances may be used to provide programmable connections between the inputs and outputs of the switchbox. For each multiplexer, values from configuration memory cells may steer the selection of one of the multiplexer inputs that is coupled to the multiplexer output. During programming of the PLD, the configuration values provided for these configuration memory cells may determine the selected programmable connections. Generally, each possible programmable connection passes through at least one of the instances of the multiplexer modules of the switchbox from an input of the multiplexer module to an output of the multiplexer module.

Respective characterizations 358 may be created for the multiplexer module or modules used to provide the programmable connections between the input and outputs of the switchbox. The generator 354 may use the characterizations 358 to determine the programmable connections specified in the PLD netlist 352 for the switchbox of identification 356. The generator 354 may first determine the switchbox pins 360 that are used to provide the programmable connections. Each programmable connection may couple an input pin of the switchbox to an output pin of the switchbox via one or more instances of a multiplexer module, and the switchbox pins 360 may include all pins of the switchbox module that may be used to provide the programmable connections. The generator 354 may trace connections in the PLD netlist 352 starting from the switchbox pins 360 and passing through one or more instances of a multiplexer module or modules having characterizations 358.

Figure 10:
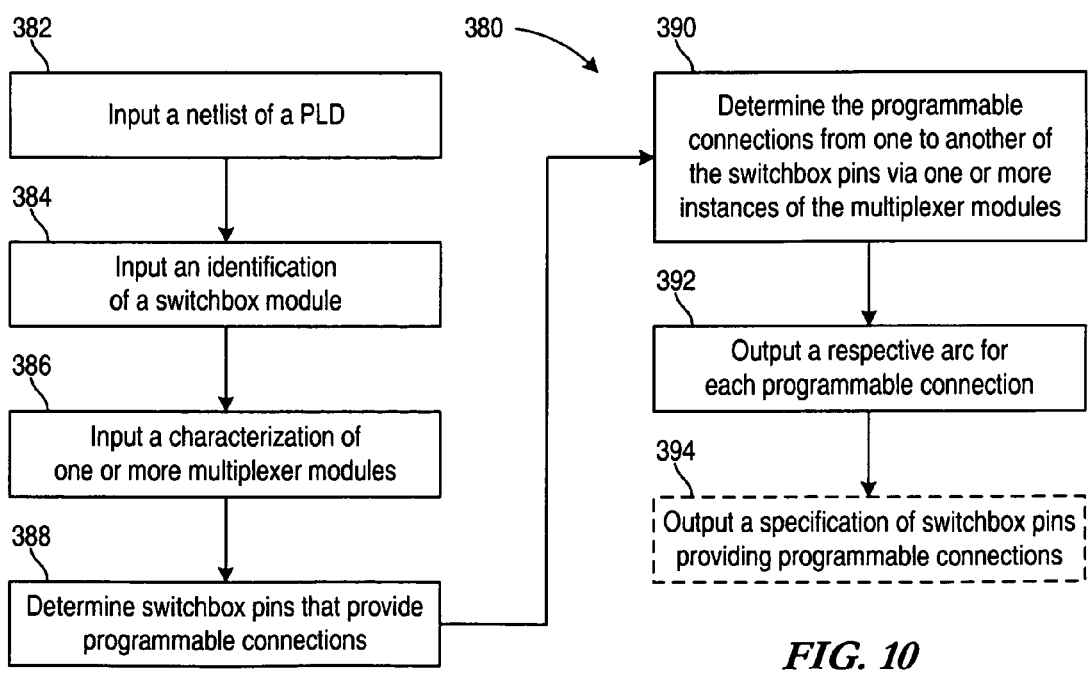
FIG. 10 is a flow diagram of a process for determining programmable connections through a switchbox of a programmable logic device in accordance with various embodiments of the invention.

FIG. 10 is a flow diagram of a process 380 for determining programmable connections through a switchbox of a programmable logic device in accordance with various embodiments of the invention. A netlist that describes the PLD design is input at step 382, an identification of a switchbox module is input at step 384, and a characterization of one or more multiplexer modules is input at step 386. The characterization of a multiplexer module may include the input pins and one or more output pins that provide the programmable connections.

At step 388, the switchbox pins are determined that provide programmable connections. A search of the PLD netlist may be performed beginning at the input and output pins of the instances within the switchbox of the multiplexer modules having the characterization of step 386. The switchbox pins for the programmable connections are the reachable pins from the search that are also pins of the switchbox. Example 2 shows pseudo-code for determining the switchbox pins providing programmable connections according to one embodiment of the invention.

Example 2:

```
For each instance within the hierarchy of the switchbox {
    If the instance has a corresponding characterization of a multiplexer {
        For each pin on the instance of the multiplexer {
            If that pin is included in the corresponding characterization of the
            multiplexer {
                Trace from that pin of the instance of the multiplexer to all
                reachable pins {
                    For each reachable pin {
                        If the reachable pin is a pin of the switchbox module {
                            Determine the direction for the reachable pin.
                            Add the reachable pin to a list of switchbox pins.
                        }
                    }
                }
            }
        }
    }
}
```

At step 390, the programmable connections are determined between switchbox pins via one or more instances of a multiplexer module. A search of the PLD netlist may be performed beginning at the switchbox pins from step 388. The search may track each pin of each instance of a multiplexer module that is used to make the programmable connection. Example 3 shows pseudo-code for determining the programmable connections according to one embodiment of the invention.

Example 3:

```
For each pin in the list of switchbox pins providing programmable
connections {
    Set the starting pin to the pin from the list.
    Trace from the starting pin to all reachable pins.
    Execute ProcessReachedPins ( reachable pins ).
}
ProcessReachedPins ( pins ) :
    For each of the pins {
        If the pin is an input pin on an instance of a multiplexer module {
            Push the input pin of the multiplexer onto a stack.
            For each output pin of the instance of the multiplexer module {
                If a programmable path exists from the input pin to the output
                pin {
```

-continued

Example 3:

```
        Push the output pin of the multiplexer onto a stack.
        Trace from the output pin to all reachable pins.
        Execute ProcessReachedPins ( reachable pins ).
        Pop the output pin of the multiplexer from the stack.
        }
    }
    Pop the input pin of the multiplexer from the stack.
} else if the pin is a pin of the switchbox {
    Set the ending pin.
    Create arc using starting and ending pins and the multiplexer pins
      on the stack.
    }
}
```

At step 392, a specification is output for an arc between the input pin and the output pin of the switchbox module for each programmable connection. In one embodiment, an arc specifies the input pin and the output pin of the switchbox module. In another embodiment, an arc specifies the input and output pins of the switchbox module and the input and output pins of each instance of a multiplexer module along the programmable connection.

The specification of the arcs for the programmable connections may be used by a router of tools that translate a user design into configuration data that implements the used design in a PLD. After mapping and placement of the logic of the user design, the router may select arcs that connect the outputs of the placed logic with the appropriate inputs of the placed logic. It will be appreciated that a single connection may require the usage of multiple switchboxes to complete the connection, corresponding to the selection of multiple arcs for the connection by the router. To route each user design without mistakes, the specified arcs should accurately model the programmable connections. Because the specification of the arcs is automatically generated, the specification of the arcs can be quickly generated following, for example, a design change of the PLD that is reflected in an updated netlist for the PLD. In addition, for a newly designed PLD that may potentially use different switchbox and multiplexer designs, the software code that implements process 380 should not need time-consuming modifications. Instead the modifications for the newly designed PLD may be limited to simply creating new identifications of the switchbox modules and new characterizations of the multiplexer module.

At optional step 394, a specification is output of the switchbox pins that are used to provide the programmable connections. These connectivity pins of a switchbox may be used to determine the non-programmable connections of a programmable tile that includes the switchbox as discussed below in connection with FIGS. 12 and 13. These non-programmable connections may be used to extend the programmable connections throughout the programmable tile.

Figure 11:
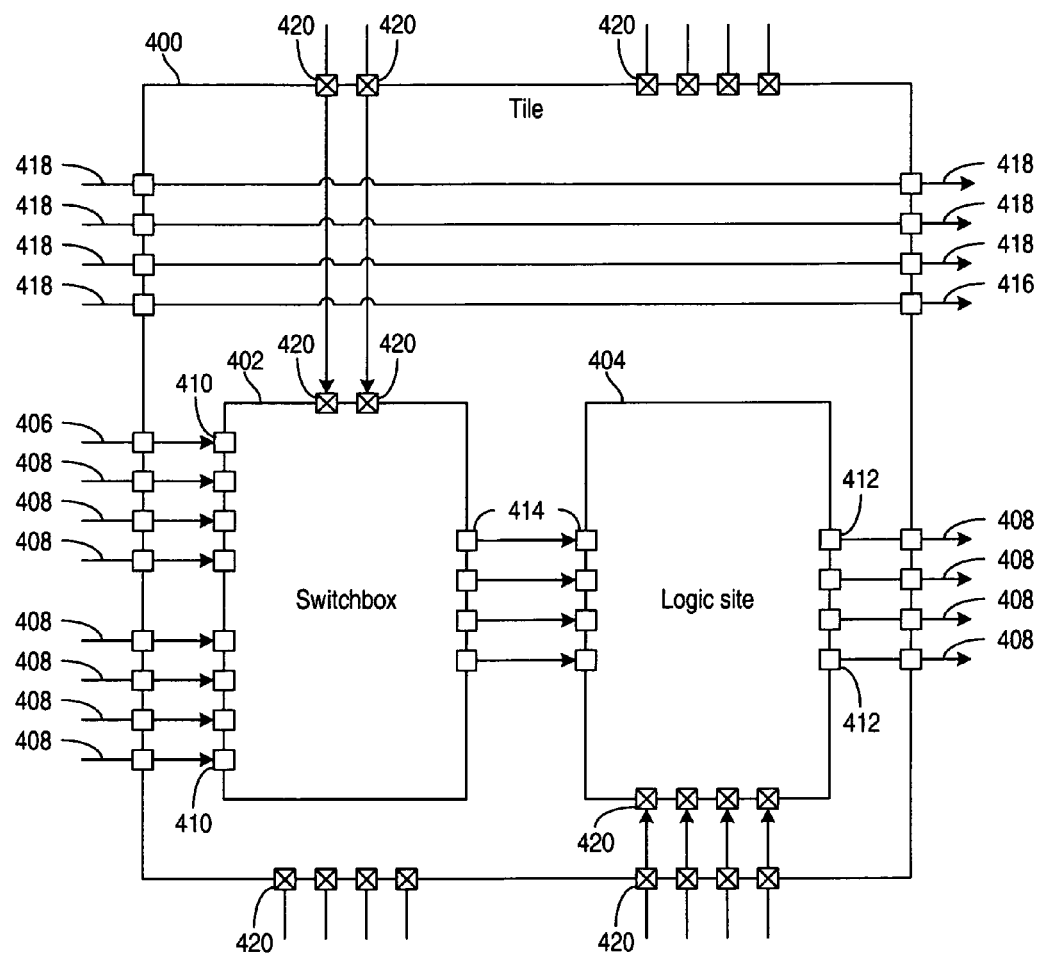
FIG. 11 is a block diagram of a programmable tile of a programmable logic device illustrating a switchbox and a logic site in accordance with various embodiments of the invention.

FIG. 11 is a block diagram of a programmable tile 400 of a programmable logic device illustrating a switchbox 402 and a logic site 404 in accordance with various embodiments of the invention. A PLD may include many instances of a particular tile module 400. For example, tile module 400 may correspond to CLB 102 of FIG. 1, and switchbox 402 and logic site 404 may respectively correspond to INT 111 and CLE 112 of FIG. 1. Alternatively, tile module 400 may correspond to BRAM 103 of FIG. 1, and switchbox 402 and logic site 404 may respectively correspond to INT 111 and BRL 113 of FIG. 1. A tile module may contain one or more switchboxes 402 and/or one or more logic sites 404. Generally, a tile module contains at least one sub-module that is either a switchbox 402 or a logic site 404, and this sub-module may be positioned within the hierarchy of the tile module.

Tile module 400 may have pins 406 and 408 that are connected within tile module 400 to pins 410 of switchbox 402 and pins 412 of logic site 404. The sub-modules of switchbox 402 and logic site 404 may also have pins 414 that are connected amongst themselves within tile module 400. The tile module 400 may also have certain pins 416 and 418 that are directly connected amongst themselves and are not connected to pins 410, 412, and 414 of switchbox 402 and logic site 404.

Pins 406, 408, 416, and 418 of the tile module and pins 410, 412, and 414 of switchbox 402 and logic site 404 are pins that may be used to implement signals of a user design. As described in connection with FIG. 2, a specification of the user design may be translated into configuration data, and a PLD may be configured to implement the user design by programming the PLD with the configuration data. Certain signals of the user design may be implemented in an instance of the tile module 400 in the PLD using the pins 406, 408, 416, and 418 of the tile module and pins 410, 412, and 414 of switchbox 402 and logic site 404. Tile module 400, switchbox 402, and logic site 404 may also include pins 420 that might not directly implement a signal of the user design because these pins 420 are used for other purposes, such as power distribution, configuration, and testing of the PLD.

While pins 416 and 418 are not connected to switchbox 402 and logic site 404 of tile module 400, a PLD may contain many instances of tile module 400 and pins 416 and 418 of one instance of tile module 400 may be connected to a switchbox 402 or a logic site 404 of another instance of tile module 400 in the PLD. For example, a PLD may include two instances of tile module 400, with pin 416 of one instance connected in the PLD to pin 406 of the other instance. Thus, pin 416 of one instance of tile module 400 may be connected to a switchbox 402 of another instance of the tile module 400.

Figure 12:
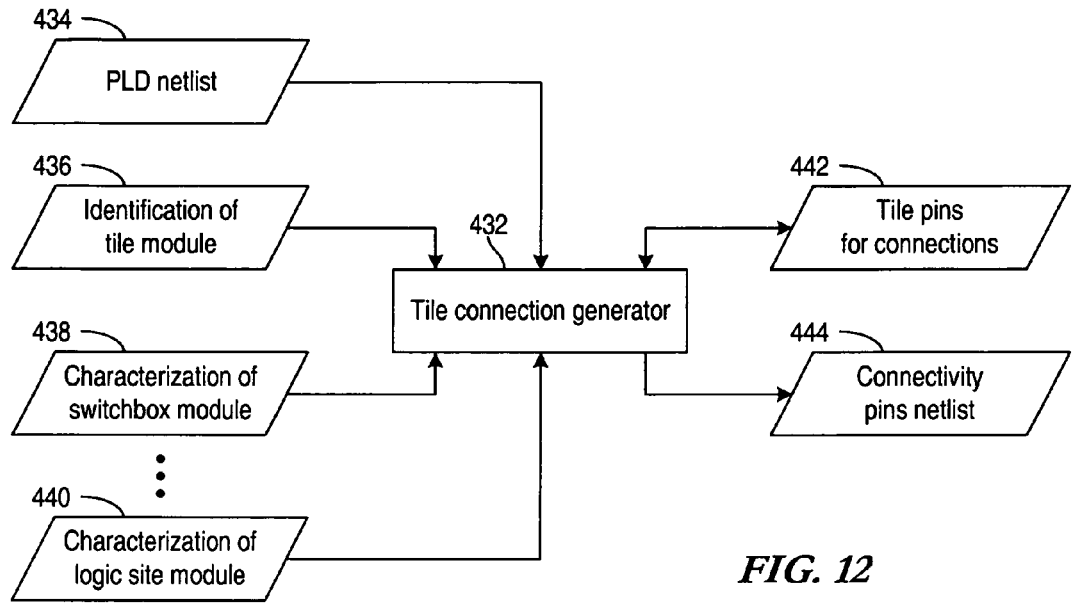
FIG. 12 is a data flow diagram of a process for determining connections of a programmable tile of a programmable logic device in accordance with various embodiments of the invention.

FIG. 12 is a data flow diagram of a process for determining connections of a programmable tile of a programmable logic device in accordance with various embodiments of the invention. A tile connection generator 432 searches a PLD netlist 434 for certain connections within and between the instances in the PLD of the tile module with identification 436. These certain connections may connect the pins of the instances of sub-modules having characterizations 438 and 440 within and between the instances of the tile module in the PLD.

The identification 436 of the tile module may specify the type of the tile module. In one embodiment, identification 436 may also specify each instance within the tile module of the sub-modules having characterizations 438 and 440. In another embodiment, the characterizations 438 and 440 include a type for the corresponding sub-module and the instances of these sub-modules are determined by examining the PLD netlist for instances that match the types of these sub-modules.

Generally, the characterizations 438 and 440 include modeled pins of the corresponding sub-modules that may be used to implement signals of a user design. For the characterization 438 of a switchbox module, these modeled pins may be automatically generated by a process for determining programmable connections through a switchbox, as discussed in connections with FIGS. 9 and 10. For example, these modeled pins may be the switchbox pins 360 for programmable connections of FIG. 9. For characterization 440 of a logic site module, the modeled pins may be manually modeled for a processor-implemented generator 432 according to one embodiment of the invention. It will be appreciated that a particular tile module may have characterizations for multiple switchbox modules and/or multiple logic site modules, or that a particular tile module may have a characterization or characterizations only for switchbox modules or only for logic site modules.

The tile connectivity generator 432 may determine pins 442 of the tile module that may be used to implement signals of a user design. The pins 442 of the tile module that may be used to implement signals of a user design may be pins of the tile module that are functionally connected to a pin of a switchbox module or a logic site module of one or more instances of the tile module. Each of the pins 442 of the tile module may be functionally connected to a modeled pin of a sub-module with characterization 438 or 440 within the tile module or between two instances in the PLD of the tile module. The PLD netlist 434 may be searched for all reachable pins within the PLD that are functionally connected to the modeled pins of the sub-modules with characterizations 438 and 440 for all instances in the PLD of the tile module. The reachable pins that are also pins of an instance of the tile module may determine the pins 442 of the tile module that may be used to implement signals of a user design. It will be appreciated that certain of the reachable pins may be functionally connected via one or more repeaters that each functionally connect specific input and output pins of the repeater.

After searching the entire PLD netlist 434 to generate certain tile pins 442, the generator 432 may determine the connectivity pins of list 444 with a search that may examine the connectivity within the tile module instead of examining the connectivity of every instance of the tile module in the PLD. The generator 432 may search for pins within the tile module that are functionally connected to starting pins that are either the tile pins 442 or the modeled pins of every instance within the tile module of a switchbox or logic site sub-module. It will be appreciated that certain of the reachable pins may be functionally connected via one or more repeaters. The generator 432 may create a network for each starting pin that is determined to not already be included in any previously created network. Each network may specify a set of pins that are functionally connected either directly or indirectly via one or more repeaters. The generator 422 may output the networks, including the set of functionally connected pins, in the list 444 of networks.

Figure 13:
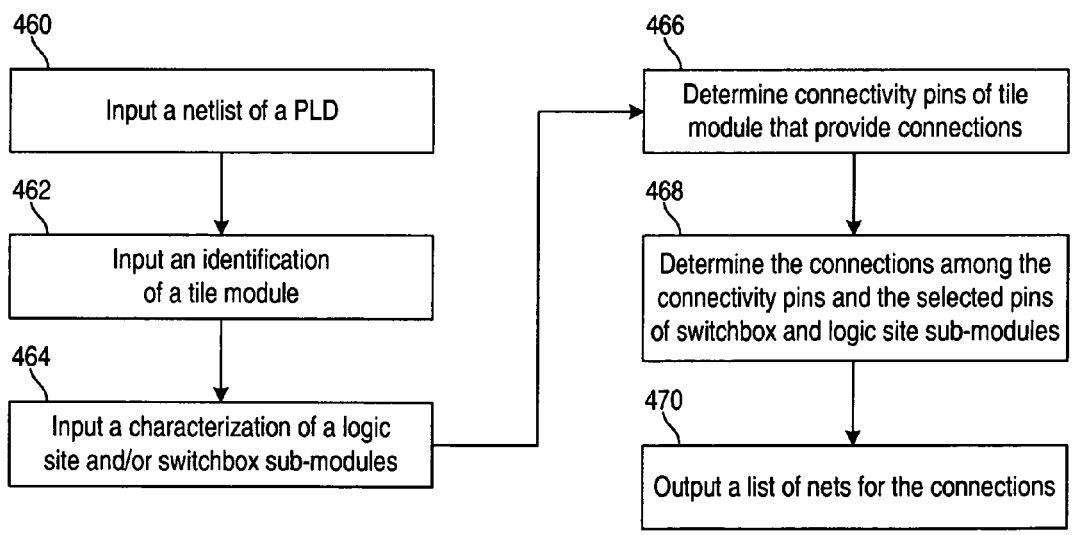
FIG. 13 is a flow diagram of a process for determining connections of a programmable tile of a programmable logic device in accordance with various embodiments of the invention.

FIG. 13 is a flow diagram of a process for determining connections of a programmable tile of a programmable logic device in accordance with various embodiments of the invention. A specification of the connections of a programmable tile may be used by a router to determine interconnections for implementing a user design in a PLD.

At step 460, a netlist that describes the PLD design is input that specifies the interconnections between the instances of various modules of the design of the PLD. An identification of the programmable tile is input at step 462, and a characterization is input for one or more sub-modules that are each either a switchbox module or a logic site module at step 464. A characterization for a sub-module includes modeled pins that may be used to implement the user design in the PLD.

The connectivity pins are determined at step 466, and the connectivity pins are a subset of the pins of the tile module that are used to provide connections for implementing a user design in a PLD. The connectivity pins of the tile module may be determined by finding all pins of the instances of the tile module that are functionally connected to an instance of either a switchbox or a logic site within an instance of a tile module.

Example 4 shows pseudo-code for determining the connectivity pins of a tile module according to one embodiment of the invention.

Example 4:

```
For each sub-module of the PLD {
    If the sub-module has a corresponding characterization of a switchbox
    or logic site {
        For each sub-module pin of the sub-module {
            If the sub-module pin is a modeled pin of the corresponding
            characterization {
                Determine all of the reachable pins from the sub-module pin.
                For each reachable pin {
                    If the reachable pin is a pin of the tile module {
                        Determine the direction of the pin of the tile module.
                        Add the pin and the direction to a list of tile pins for
                        connections.
                    }
                }
            }
        }
    }
}
```

At step 468, a list of networks may be determined that interconnects the connectivity pins and the modeled pins of the tile module. The networks may be determined by finding all pins that are functionally connected to the connectivity pins and the modeled pins in the PLD netlist. Example 5 shows pseudo-code for determining the networks according to one embodiment of the invention.

Example 5:

```
For each tile pin that is a connectivity pin {
    Add the tile pin to a list of starting pins.
}
For each sub-module of the tile {
    If the sub-module has a corresponding characterization of a switchbox
    or logic site {
        For each sub-module pin of the sub-module {
            If the sub-module pin is a modeled pin of the corresponding
            characterization {
                Add the sub-module pin to the list of starting pins.
            }
        }
    }
}
For each starting pin of the list {
    If the starting pin is not already visited {
        Create a network that includes the starting pin.
        Mark the starting pin as visited.
        Determine all of the reachable pins from the starting pin.
        For each reachable pin {
            Add the reachable pin to the network.
            Mark the reachable pin as visited.
        }
    }
}
```

At step 470, the list of networks may be output, and optionally the connectivity pins may also be output. The list of networks for the connections of the programmable tile may be combined with the programmable connections of any switchboxes included within the hierarchy of the programmable tile to yield the connections that may be created by a tile to implement a portion of a user design in a PLD. Referring to FIG. 2, the list of networks may correspond to fixed tile routing arcs 148 and the programmable connections of the switchbox or switchboxes may correspond to programmable tile routing arcs 150. After the mapper and placer 136 has assigned a portion of a user design to a particular instance of a tile, the router 138 may create the appropriate connections using the routing arcs 148 and 150.

Figure 14:
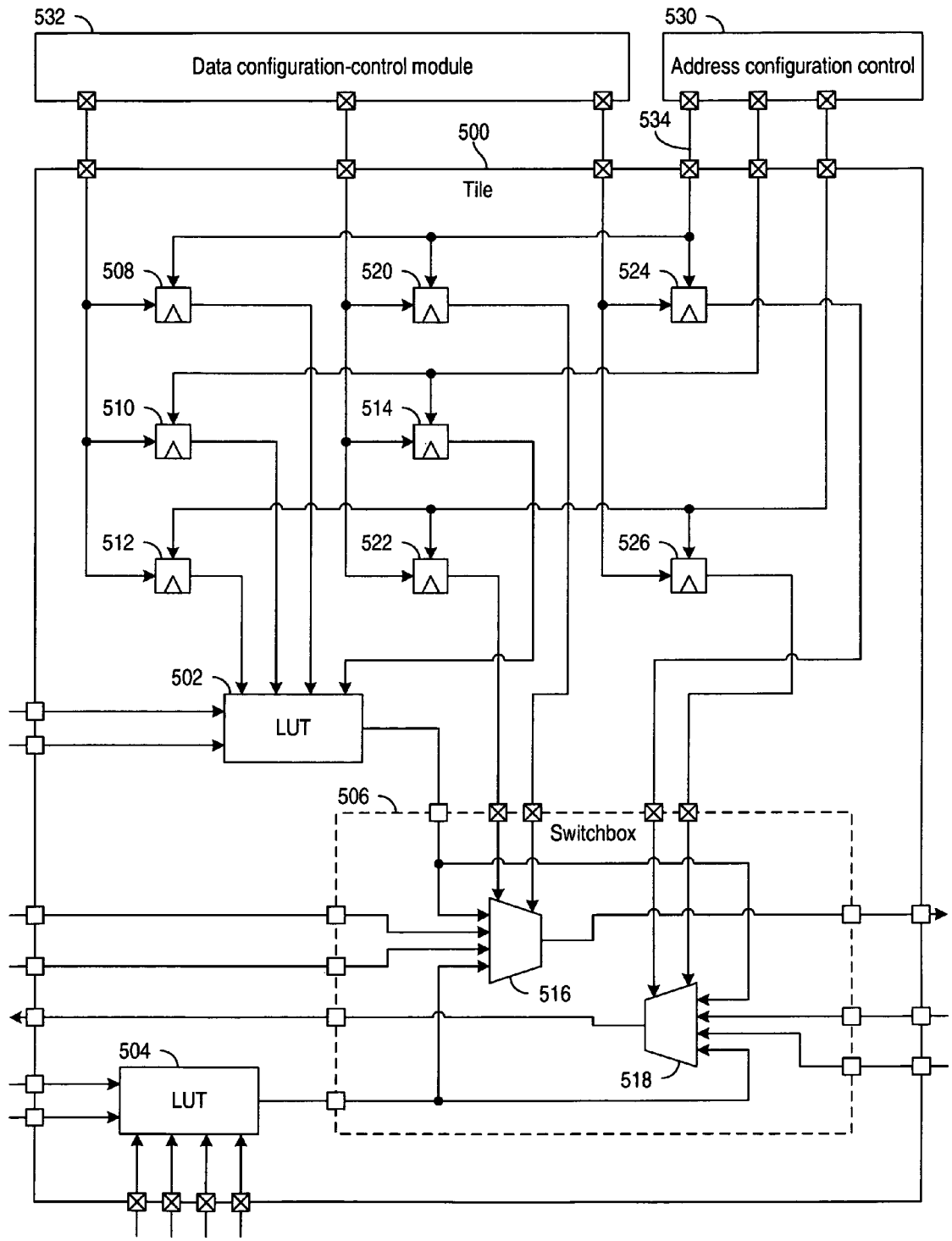
FIG. 14 is a block diagram illustrating configuration memory of a programmable tile of a programmable logic device in accordance with various embodiments of the invention.

FIG. 14 is a block diagram illustrating configuration memory of a programmable tile 500 of a programmable logic device in accordance with various embodiments of the invention. The configuration memory may be programmed with configuration data that is generated from a specification of a user design, and configuration memory may control the operation of the programmable interconnect and logic resources of the PLD such that the user design is implemented by the PLD.

The programmable tile 500 may include look-up table (LUT) logic sites 502 and 504, and switchbox 506. The function of LUT logic site 502 may be controlled by cells 508, 510, 512, and 514 of the configuration memory to implement any function of two inputs. The function of LUT logic site 504 may be controlled by configuration memory cells that are external to tile module 500. Switchbox 506 may include two multiplexers 516 and 518. The function of multiplexer 516 may be controlled by configuration memory cells 520 and 522, and the function of multiplexer 518 may be controlled by configuration memory cells 524 and 526. Thus, the values of configuration memory cells 508, 510, 512, 514, 520, 522, 524, and 526 may determine the function of tile module 500. LUT logic sites 502 and 504 and multiplexers 516 and 518 may each have select inputs for receiving control values from the configuration memory cells 508, 510, 512, 514, 520, 522, 524, and 526.

During the programming of the PLD with configuration data generated from a specification of a user design, values from the configuration data may be written to the configuration memory cells 508, 510, 512, 514, 520, 522, 524, and 526 using the configuration modules 530 and 532. For example, address module 530 may generate a write enable on line 534 that writes a frame of the configuration data from data module 532 into configuration memory cells 508, 520, and 524. Generally, the configuration memory cells 508, 510, 512, 514, 520, 522, 524, and 526 are arranged in a functional matrix determined by the addressing lines, such as write enable 534, from the address module 530 and the data transfer lines from the data module 532.

It will be appreciated that the configuration memory cells 508, 510, 512, 514, 520, 522, 524, and 526 might not have the arrangement in a layout of a physical array of configuration memory cells. For example, during the design of the tile for tile module 500, the circuitry for LUTs 502 and 504 and multiplexers 516 and 518 may physically placed within a tile and related interconnects routed before placing configuration memory cells in the spaces remaining available within the tile. To route the interconnect for the configuration memory cells in the routing area remaining available, the schematic for the tile module 500 may be modified to match the connections that may be made in the remaining routing area. These modifications may change the particular configuration memory cell that controls each select input of LUT logic sites 502 and 504 and multiplexers 516 and 518, and these modifications may also change the connections between the configuration memory cells and the configuration modules 530 and 532. Such modifications may be made during physical layout of the tile module 500 near the end of designing a PLD. Thus, the actual configuration memory cell controlling each select input and the position of each configuration memory cell in the functional matrix might not be fully determined until the design of the PLD is nearly completed.

Figure 15:
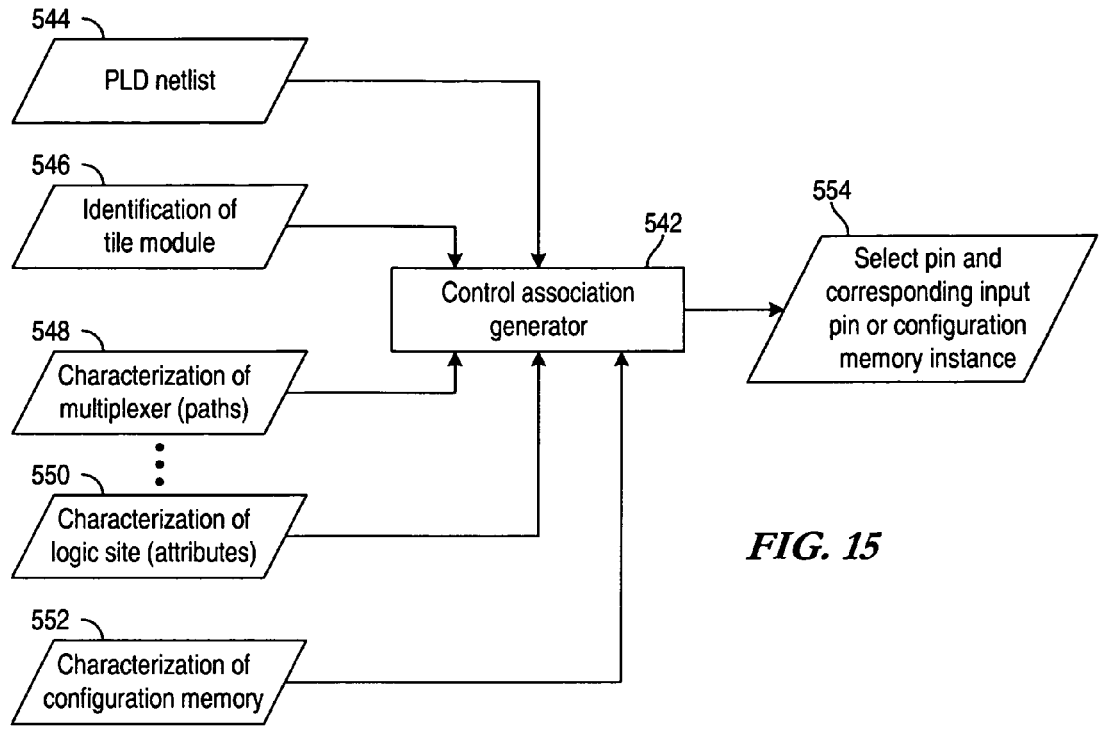
FIG. 15 is a data flow diagram of a process for determining control of a select pin of a programmable tile of a programmable logic device in accordance with various embodiments of the invention.

FIG. 15 is a data flow diagram of a process for determining control of a select pin of a programmable tile of a programmable logic device in accordance with various embodiments of the invention. A generator 542 of control associations may determine the configuration memory cell that controls each select pin of each programmable function of the PLD. Usage of generator 542 may eliminate the manual extraction of control associations that may be time-consuming and difficult because, for example, the various configuration memory cells may have confusingly similar names.

A PLD netlist 544 is searched by the generator 542 to determine the functional connections between the data output pins of instances within a tile of configuration memory cells and the select pins of instances within the tile of logic site modules and multiplexer modules. The identification 546 may include a type of the tile module and the control associations may be determined for the tile module that matches the type. Characterizations 548 and 550 may specify the type and the select input pin or pins of a logic site module and a multiplexer module, respectively. It will be appreciated that, depending on the tile module, control association generator 542 may receive a respective characterization for one or more logic site modules and/or for one or more multiplexer modules. In addition, control association generator 542 may receive characterizations 552 for one or more configuration memory cells. Characterization 552 may specify the type and the data output pin of a configuration memory cell. Generator 542 may use the identification 546 of the tile module and characterizations 548, 550, 552 to search the PLD netlist 544 for the control associations.

The control association generator 542 may output a specification 554 of the controlling pin for each select pin of each instance of the logic site and multiplexer modules with characterizations 548 and 550. The specification 554 may list each select pin paired with the corresponding controlling pin. The select pins may be controlled by the data output pin of a configuration memory cell that is internal or external to the tile module. For a select pin that is controlled by a configuration memory cell that is internal to the tile module, the controlling pin is the data output pin of a configuration memory cell within the tile module. For a select pin that is controlled by a configuration memory cell that is external to the tile module, the controlling pin may be specified in specification 554 as the pin of the tile module that connects the select pin to the data output pin of the external configuration memory cell.

In one embodiment, the characterization 548 for a multiplexer module includes a specification of paths through the multiplexer module and for each path a respective value of the select input pins that activate the path through the multiplexer. The generator 542 may output the specification 554 that includes the respective value of the select input pin for each path through each instance of the multiplexer within the tile module. In one embodiment, the characterization 550 for a logic site module includes a specification of an attribute or attributes of the logic site module and a respective value of the select input pins of the logic site module for each accepted value of each attribute. The generator 542 may output the specification 554 that includes the respective value of the select input pins of the logic site module for each accepted value of each attribute.

Referring back to FIG. 2, the memory cell relationships 152 may include the specification 554 of the select pins and the corresponding controlling pins for each type of programmable tile module in a PLD. Serializing generator 140 may use the specification 554 for a tile module to map a portion of a user design that is implemented by an instance of the tile module to specific values of the associated configuration memory cells.

Figure 16:
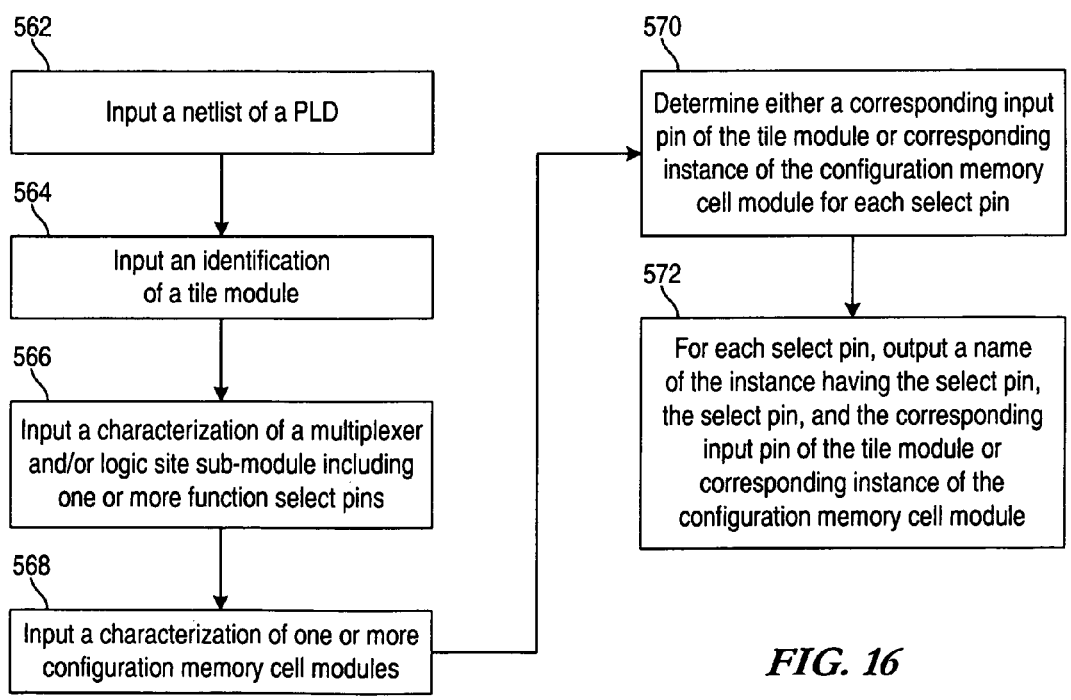
FIG. 16 is a flow diagram of a process for determining control of a select pin of a programmable tile of a programmable logic device in accordance with various embodiments of the invention.

FIG. 16 is a flow diagram of a process for determining control of a select pin of a programmable tile of a programmable logic device in accordance with various embodiments of the invention. For each select pin of a multiplexer or logic site within the tile module for the programmable tile, a corresponding controlling pin is determined.

A PLD netlist is input at step 562, and an identification of a tile module within the PLD netlist is input at step 564. At step 566, a characterization or characterizations are input for one or more multiplexer and/or logic site sub-modules that are instantiated within the tile module. Each sub-module characterization specifies one or more select pins that determine the programmable function performed by the corresponding sub-module. For a multiplexer, the value of the select pins may determine which input of the multiplexer is selected to drive the output of the multiplexer. For a logic site, the value of the select pins may determine the logic function of the logic site. For example, the logic site may be a look-up table having a respective select input providing the output value from the look-up table for each possible combination of input values. At step 568, a characterization or characterizations are input for one or more configuration memory cells. Each cell characterization includes a data output pin that may be connected in the PLD netlist to a select input of a multiplexer or logic site sub-module.

At step 570, the controlling pin is determined for each select pin of each instance within the tile module of each multiplexer or logic site sub-module. The PLD netlist may be searched starting from the select pins of each instance of each multiplexer or logic site within the tile module to determined the reachable pin or pins that are functionally connected to each select pin. The controlling pin for a select pin is the reachable pin for the select pin that is either the data output pin of a configuration memory cell or an input pin of the tile module. The reachable pin is a pin of the tile module when the configuration memory cell controlling the select pin is external to the tile module. It will be appreciated that the data output pin of a configuration memory cell may be functionally connected to a select pin via one or more repeater modules.

Example 6 shows pseudo-code for determining the controlling pin for each select pin according to one embodiment of the invention.

Example 6:

```
For each sub-module within the tile {
    If the sub-module has a corresponding sub-module characterization {
        For each sub-module pin of the sub-module {
            If the sub-module pin is a select pin of the sub-module
            characterization {
                Determine all of the reachable pins from the sub-module pin.
                For each of the reachable pins {
                    If the reachable pin is a data output pin of a configuration
                    memory cell {
                        Output the reachable pin as the controlling pin of the select
                        pin.
                    } Else if the reachable pin is an input pin of the tile module {
                        Output the reachable pin as the controlling pin of the select
                        pin.
                    }
                }
            }
        }
    }
}
```

Figure 17:
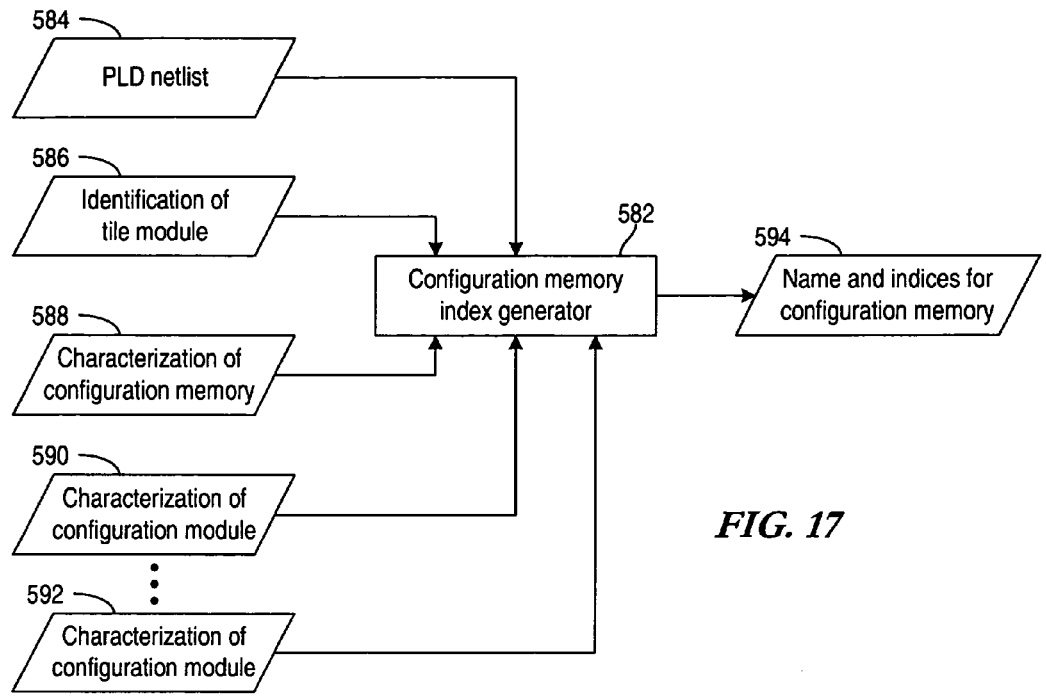
FIG. 17 is a data flow diagram of a process for determining indices of an instance of a cell of configuration memory in accordance with various embodiments of the invention.

FIG. 17 is a data flow diagram of a process for determining indices of an instance of a cell of configuration memory in accordance with various embodiments of the invention. The indices of an instance of a cell of configuration memory may include an address index and a data index, which may correspond to a row and a column in a functional matrix of the configuration memory cells. The functional matrix of configuration memory cells may correspond to a physical organization of the configuration memory cells in a PLD; however, the configuration memory cells might not be arranged in a physical array. In one embodiment, each configuration memory cell may be coupled to an address line and a data line. The address index may be specified by the position of the address line in an ordered set of address lines for accessing the configuration memory cells in the PLD, and the data index may specified by the position of the data line in an ordered set of data lines for accessing the configuration memory cells in the PLD.

A generator 582 of configuration memory indices may input a PLD netlist 584 and an identification 586 of a tile module. The generator 582 may search the PLD netlist 584 to determine the indices of the instances of the configuration memory cells within the tile module identified by identification 586, and the identification 586 may identify the tile module using a type of the tile module.

Characterization 588 may specify a type of one or more cells of configuration memory along with an address input pin and a data input pin for each type of configuration memory cell. Characterizations 590 and 592 may specify a type for one or more configuration control modules, and together characterizations 590 and 592 may specify an ordered set of address output pins of the configuration control modules and an ordered set of data output pins of the configuration control modules. In one embodiment, a PLD has one configuration control module providing the address output pins and another configuration control module providing the data output pins. Thus, characterization 590 may specify the type of the address configuration-control module and the ordered set of address output pins, and characterization 592 may specify the type of the data configuration-control module and the ordered set of data output pins.

Generator 582 may output a specification 594 of the indices, such as a numeric address index and a numeric data index, for each configuration memory cell within the tile module of identification 586. Each configuration memory cell may be identified in specification 594 by a hierarchical name of the configuration memory cell, which may be a hierarchical name within the tile module. A numeric address or data index may be a relative index among the configuration memory cells within the tile module.

Figure 18:
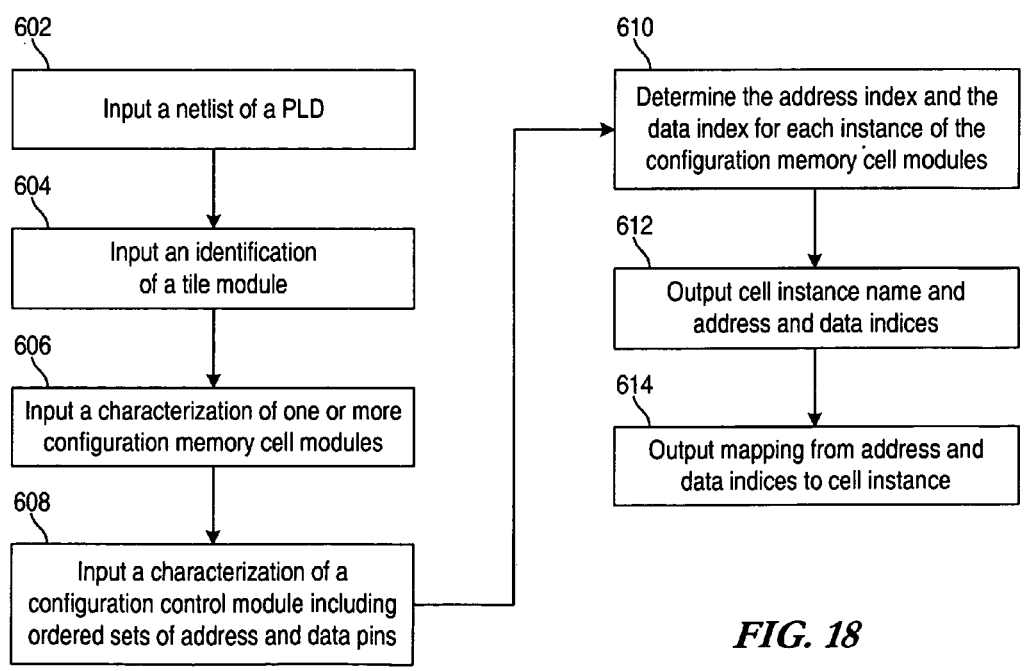
FIG. 18 is a flow diagram of a process for determining indices of an instance of a cell of configuration memory in accordance with various embodiments of the invention.

FIG. 18 is a flow diagram of a process for determining indices of an instance of a cell of configuration memory in accordance with various embodiments of the invention. For each instance of a configuration memory cell within a tile module, an address index and a data index may be determined.

A netlist is input at step 602 and an identification of a tile module is input at step 604. The identification 604 may include a type of the tile module. At step 606, a characterization of one or more configuration memory cells is input. Each characterization may include the type of the configuration memory cell and an address input pin and a data input pin of the configuration memory cell. At step 608, a characterization of one or more configuration control modules is input. Each characterization may include a type of the configuration control module and collectively the characterizations include an ordered set of address output pins of the configuration control module or modules and an ordered set of data output pins of the configuration control module or modules.

At step 610, the address index and the data index is determined for each instance within the tile module of the configuration memory cells. The configuration memory cells coupled to the first address output pin in the ordered set of address output pins of a configuration control module may have an address index of one, the configuration memory cells coupled to the second address output pin in the ordered set may have an address index of two, and et cetera. The data index for each configuration memory cell may be similarly specified. The PLD netlist may be searched for pins that are reachable starting from the address input pin and the data input pin of every instance of a configuration memory cell within a tile module. The address index of a configuration memory cell may be determined by the reachable pin that is an address output pin of a configuration control module, and the data index of the configuration memory cell may be determined by the reachable pin that is a data output pin of a configuration control module. At step 612, the address and data indices are output for each instance of the configuration memory cell within the tile module along with a name of the instance.

Example 7 shows pseudo-code for determining the indices of an instance of a configuration memory cell according to one embodiment of the invention.

Example 7:

```
For each sub-module with the tile {
    If the sub-module has a corresponding cell characterization {
        Add sub-module to a map of the cells of configuration memory.
        Call TraceToSource ( with address output pin from the cell
            characterization ).
        Call TraceToSource ( with data output pin from the cell
            characterization).
    }
}
TraceToSource ( cell pin ):
    Determine the reachable pins from the cell pin.
    For each of the reachable pins {
        If the module of the reachable pin has a configuration control
            characterization {
            If the reachable pin is included in an ordered set of the
                characterization {
                Associate index in the ordered set with the reachable pin and the
                    cell pin.
            }
        }
    }
```

Referring back to FIG. 2, a serializing generator 140 may receive from memory cell organization 154 the indices of the configuration memory cells within each type of tile module. The serializing generator 140 may use the indices to map the value of each configuration memory cell to a specific bit of the configuration data 132.

The specification of the cell instances and the first and second indices of the cell indices that are output at step 612 may provide a mapping from each of the cell instances to the indices of the cell instance. A reverse mapping from the indices of the cell instances to the cell instance may be useful for generating the configuration data. The generation of the configuration data may loop through each combination of values for the indices for each bit of the configuration data, and the reverse mapping may be used to determine the corresponding cell instance to obtain the value to be stored in the cell instance by the bit of the configuration data. In one embodiment, a two-dimensional data structure may be output at step 614 to map from the indices to the corresponding instance of a configuration memory cell. Example 8 shows pseudo-code for generating a two-dimensional array for the reverse mapping according to one embodiment of the invention.

Example 8:

```
Initialize two-dimensional array to empty.
For each cell instance {
    Add cell instance to the two-dimensional array at the indices of the cell
        instance.
}
```

It will be appreciated that the process of determining control of select pins of instances of a configuration memory cell (FIGS. 15 and 16) might be integrated together with the process of determining the indices of the instances of a configuration memory cell (FIGS. 17 and 18). The separation of these processes in various embodiments of the invention is useful for simplifying each of the software programs that implement these individual processes. The maintenance and clarity of these software programs is improved by the simplification resulting from using separate software programs.

Figure 19:
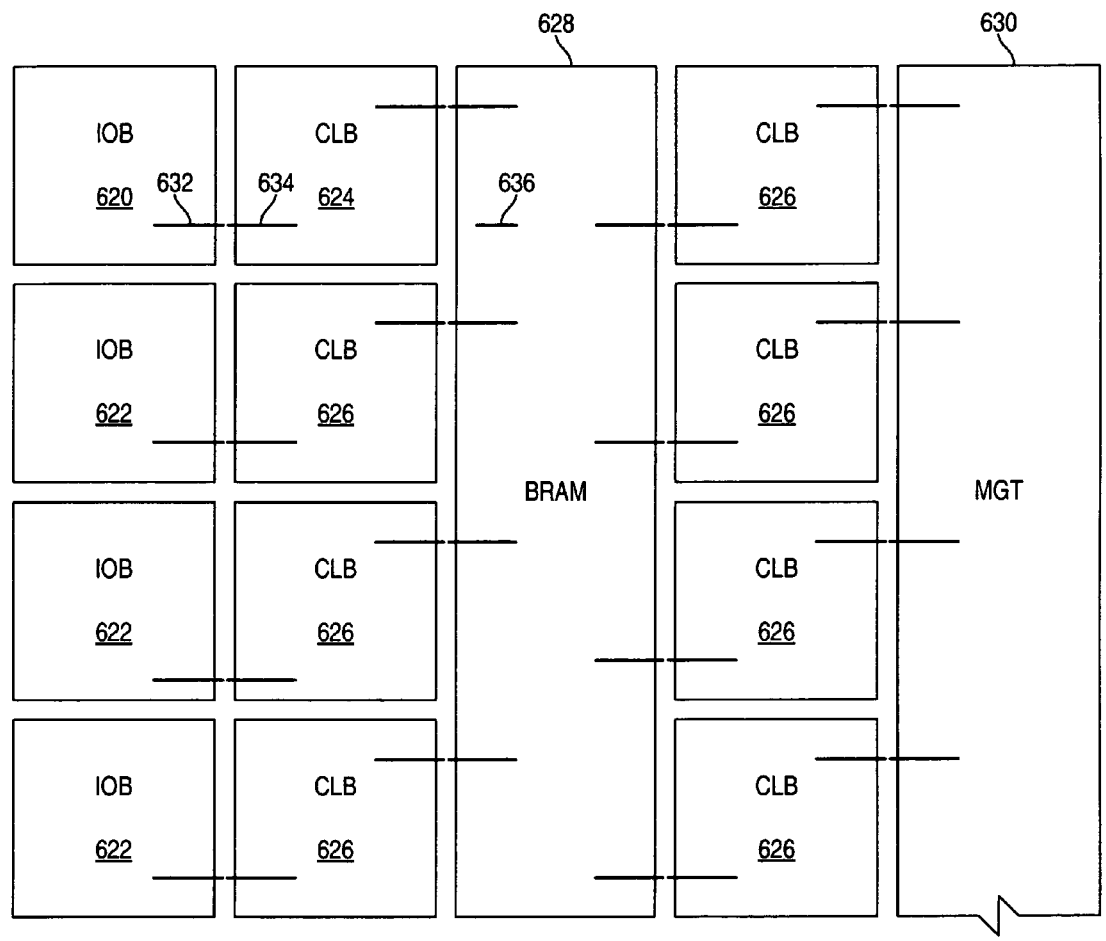
FIG. 19 is a block diagram of a portion of a programmable logic device illustrating connections between programmable tiles in accordance with various embodiments of the invention.

FIG. 19 is a block diagram of a portion of a programmable logic device illustrating connections between programmable tiles in accordance with various embodiments of the invention. The PLD may include tile instances 620 and 622 of input-output modules that may correspond to IOBs 104 of FIG. 1, tile instances 624 and 626 of modules for configurable logic blocks that may correspond to CLBs 102 of FIG. 1, tile instance 628 of a block RAM module that may correspond to one of BRAMs 103 of FIG. 1, and tile instance 630 of a module for multi-gigabit transceivers that may correspond to one of MGTs 101 of FIG. 1.

The netlist of the PLD may specify connections between the tile instances 620 through 630. Frequently, these connections may connect pins of modules of the tile instances 620 through 630 that are physically adjacent in a layout of the integrated circuit for the PLD. For example, the netlist and the layout of the PLD may include a network connecting the pin on line 632 of IOB tile instance 620 to the pin on line 634 of the adjacent CLB tile instance 624. The tile instances may also include internal networks that are not connected to a network of any other tile instance, for example, network 636 may be an internal network of BRAM tile instance 628.

Figure 20:
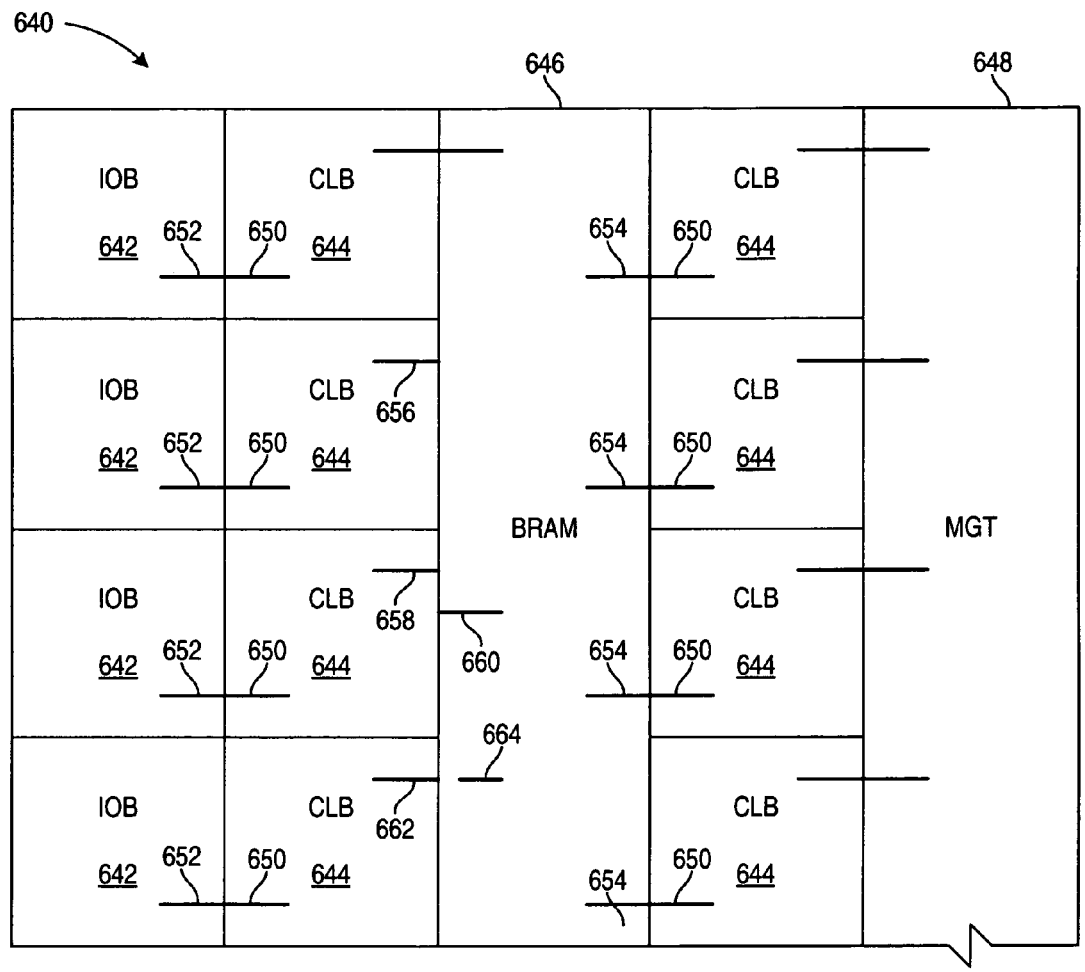
FIG. 20 is an example diagram of a user interface illustrating a graphical representation of a programmable logic device in accordance with various embodiments of the invention.

FIG. 20 is an example diagram of a user interface illustrating a graphical representation 640 of a programmable logic device in accordance with various embodiments of the invention. The graphical representation 640 of the PLD may include occurrences 642 of a tile representation for an IOB tile module corresponding to IOB tile instances 620 and 622 of FIG. 19. The graphical representation 640 may also include occurrences 644 of a tile representation corresponding to CLB tile instances 624 and 626 of FIG. 19, occurrence 646 of a tile representation corresponding to BRAM tile instance 628 of FIG. 19, and occurrence 648 of a tile representation corresponding to MGT tile instance 630 of FIG. 19. Each of occurrences 642, 644, 646, and 648 may include connection representations, such as connection representations 650 of occurrences 644. In this example, the occurrence 646 of a BRAM tile representation has several errors that may be detected by certain embodiments of the invention.

Each connection representation 650 may represent a pin, such as the pin on line 634 of FIG. 19, of the corresponding tile module. Connection representations that represent a pin of the corresponding tile module generally terminate at a boundary of the occurrence. For example, each connection representation 650 of occurrences 644 represents a pin of a CLB tile module and terminates at a boundary of the respective occurrence 644. Two tile representations that are adjacent in the graphical representation 640 may have an abutting portion of their respective boundaries, and the abutting portion may be a shared portion of their respective boundaries. The coupling of two connection representations may be indicated in the graphical representation 640 by having the two connection representations terminate at the same position of an abutting portion of the boundaries of the two corresponding occurrences. For example, the graphical representation 640 may indicate that the connection representations 650 of certain of the occurrences 644 may be coupled to connection representations 652 of adjacent occurrences 642, while the connection representations 650 of certain other of the occurrences 644 may be coupled to connection representations 654 of adjacent occurrence 646.

Generally, for a graphical representation indicating a coupling of respective connection representations of adjacent occurrences of one or more tile representations, the netlist of the PLD should include a network coupling corresponding pins of the instances of the tile modules represented by the occurrences of the tile representations. The absence of such a network in the netlist of the PLD may signify an error in one or both of the tile representations. It will be appreciated that because a tile representation may be an abstraction that omits many details of the tile module, a network coupling pins of instances does not imply that the graphical representation should indicate a coupling of corresponding connection representations.

In one embodiment of the invention, each connection representation that terminates on the boundary of a tile representation should have a matching connection representation at the position of the abutting portion of the boundaries between the adjacent occurrences of the tile representations. Connection representation 656, which terminates at the boundary of one of occurrences 644, does not have a matching connection representation at the position of the abutting portion of the boundary with occurrence 646. This mismatch may be due to the error of a missing connection representation for occurrence 646. Connection representation 658 does not have a matching connection representation at the position of the abutting portion of the boundaries. This mismatch may be due to the error of connection representation 660 being placed at the wrong position of the boundary of occurrence 646. Connection representation 662 also does not have a matching connection representation, and this mismatch may be due to the error of connection representation 664 not terminating at the boundary of occurrence 646.

Figure 21:
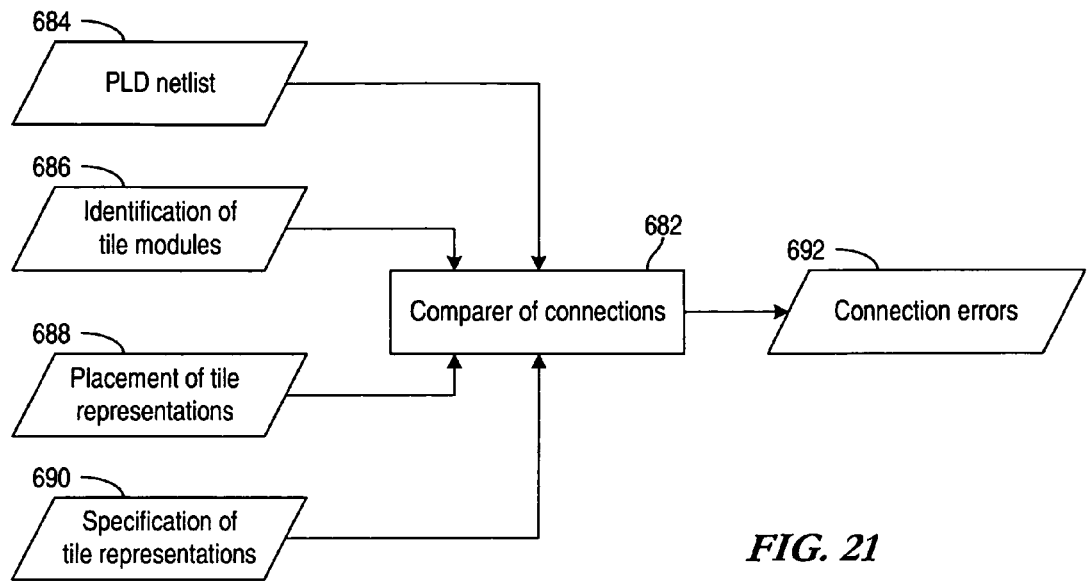
FIG. 21 is a data flow diagram of a process for comparing connections between a graphic representation of a programmable logic device and a netlist for the programmable logic device in accordance with various embodiments of the invention.

FIG. 21 is a data flow diagram of a process for comparing connections between a graphic representation of a programmable logic device and a netlist for the programmable logic device in accordance with various embodiments of the invention. The graphic representation may be checked for matching connection representations along the abutting portion of the boundaries between each pair of adjacent occurrences of tile representations in the graphical representation. For each pair of matching connection representations between a pair of adjacent occurrences of the tile representations, the PLD netlist may be checked for a corresponding network connecting pins of the instances of the tile modules that correspond to the occurrences of the tile representations.

A comparer 682 of connections inputs a PLD netlist 684 and an identification 686 of each of the tile modules of the PLD. The identification 686 may include a type of each of the tile modules included in the PLD netlist 684.

The comparer 682 may also input a specification 688 of the placement of the occurrences of the tile representations in the graphical representation. The placement of the occurrences and the size and shape of the tile representations may determine the occurrences that are adjacent and share an abutting portion of their boundaries. In one embodiment, the placement of the occurrences may be provided by data that determines a presentation of the occurrences of the tile representations in a user interface. Frequently, the tile representations are rectangular with various heights and/or widths, and the occurrences of the tile representations are arrayed to completely cover an area of a display of the user interface without overlapping. The arrayed placement of the occurrences of the tile representations in the graphical representation generally reflects the layout of the instances of the tile modules in the PLD.

The comparer 682 may input a specification 690 of the tile representations including connection representations for selected networks of the tile module for the tile representation. The specification 690 may include connection representations for selected networks, and for certain of the selected networks corresponding to pins of the tile module for the tile representation, the connection representations for these certain selected networks may be specified to terminate at a particular position on the boundary of the tile representation. The specification 690 may specify coordinates defining the boundary of the tile representation and coordinates defining a line segment for each of the connection representations of the tile representation. These boundary and connection representation coordinates may be coordinates that are used to present each occurrence of the tile representation on a display of a user interface.

Two connection representations from respective adjacent occurrences are coupled in the graphical representation when the connection representations terminate at the same position on the abutting portion of their shared boundaries. The comparer 682 checks for mismatched connection representations, and checks that each matched connection representation has a corresponding network connection in the PLD netlist 684. Any detected errors may be output in connection error messages 692.

Figure 22:
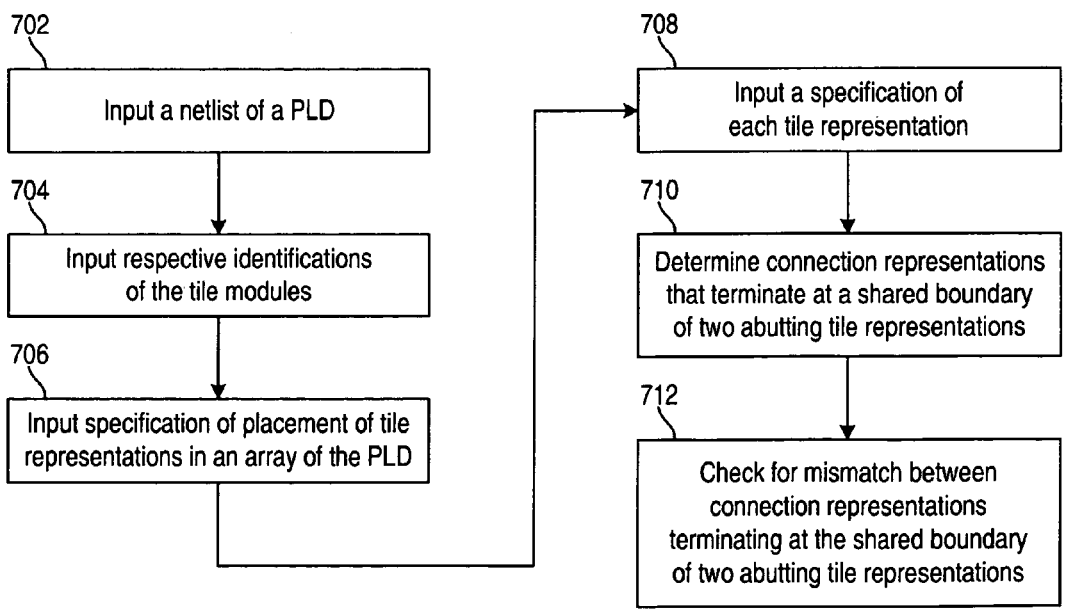
FIG. 22 is a flow diagram of a process for comparing connections between a graphic representation of a programmable logic device and a netlist for the programmable logic device in accordance with various embodiments of the invention.

FIG. 22 is a flow diagram of a process for comparing connections between a graphic representation of a programmable logic device and a netlist for the programmable logic device in accordance with various embodiments of the invention. At step 702, a netlist that describes the PLD design is input that specifies a list of networks, with each network connecting pins of module instances, including various tile module instances. At step 704, a respective identification is input for each of the tile modules, and these identifications may be used to identify pins of the instances of the tile modules in the PLD netlist. A specification of the arrayed placement of occurrences of the tile representations in the graphical representation is input at step 706, and a specification of each tile representation, including connection representations, is input at step 708.

At step 710, the connection representations are determined that terminate at a shared portion of the abutting boundaries of the adjacent occurrences of the tile representations. The position of termination of each connection representation may also be determined.

At step 712, mismatched connection representations are checked. In one embodiment, two connection representations of adjacent occurrences are coupled when the connection representations terminate at the same position on the abutting portion of the shared boundaries. Each connection representation may have a name in the tile representation that may be mapped to a corresponding pin of the tile module for the tile representation. For two connection representations that are coupled in the graphical representation, the PLD netlist may be checked to verify that a network forms a corresponding connection between the mapped pins of the tile instances corresponding to the adjacent occurrences. In addition, the graphical representations may be checked to verify that each connection representation that terminates at a position on the boundary of an occurrence has a matching connection representation terminating at this position for an adjacent occurrence. Example 9 shows pseudo-code for checking for mismatched connection representations according to one embodiment of the invention.

Example 9:

```
For each tile representation {
    For each connection representation in the tile representation {
        For each line segment of the connection representation {
            For each endpoint of the line segment {
                If the endpoint is at an abutment boundary of the tile
                representation {
                    Insert connection representation into a list ordered by position
                    on boundary.
                }
            }
        }
    }
}
For each pair of an adjacent first and second occurrence of tile
representations {
    For each coordinate position on the abutment boundary of the adjacent
    occurrences {
        Get terminating connection representation from first occurrence,
        if any.
        Get terminating connection representation from second occurrence,
        if any.
        If connection representations exist for both the first and
        second occurrence {
            Get corresponding networks from the PLD netlist.
            If the corresponding networks are not connected in the PLD
            netlist {
                Issue unexpected abutment error.
            }
        } else if only one connection representation exists for the
        occurrences {
            Issue unmatched abutment error.
        }
    }
}
```

Figure 23:
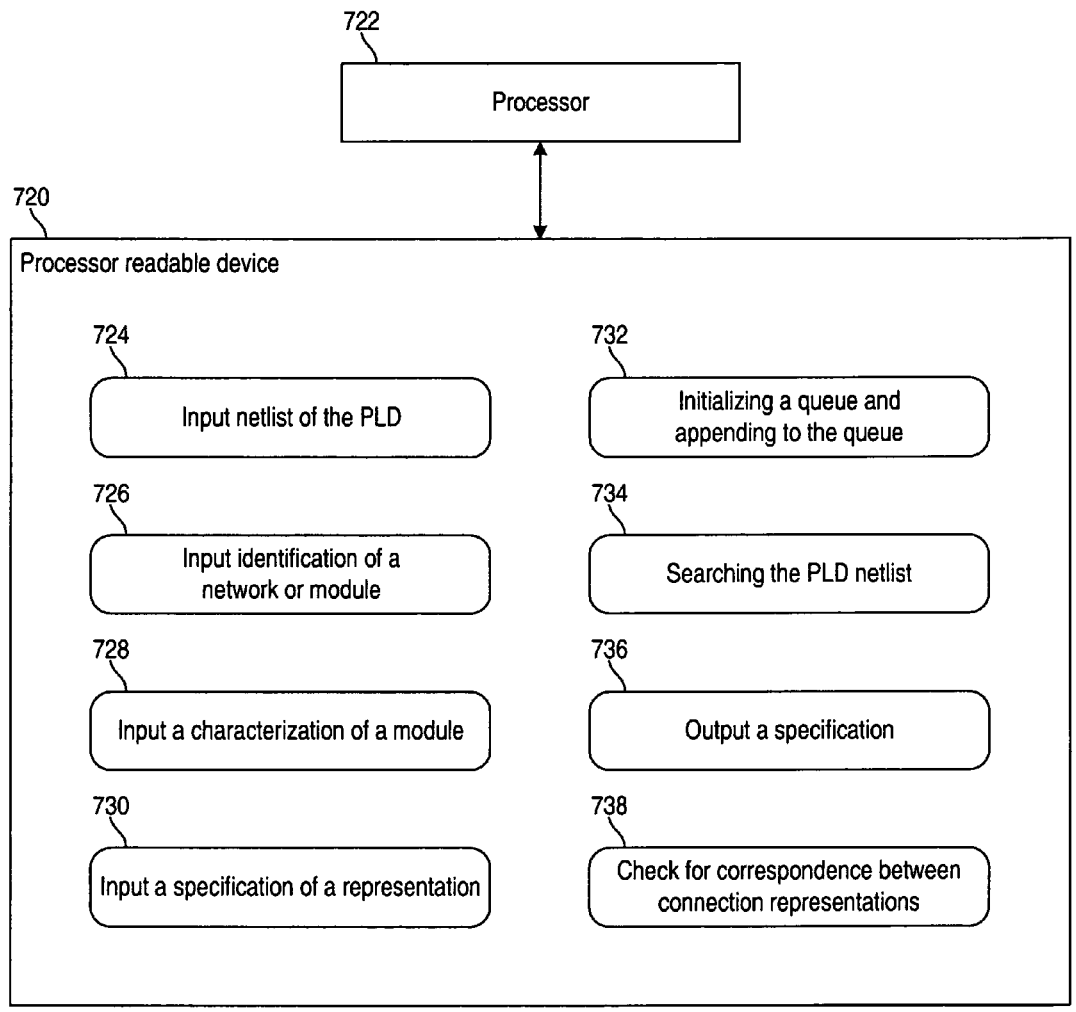
FIG. 23 is a block diagram of a system for processing a PLD netlist in accordance with various embodiments of the invention.

FIG. 23 is a block diagram of a system for processing a PLD netlist in accordance with various embodiments of the invention. A processor-readable device 720 may be configured with instructions and a processor 722 or processors may perform various operations during execution of the instructions. The operations may include searching the PLD netlist to determine various properties of the PLD.

Software 724 may include instructions for inputting the netlist that describes the PLD design specifying connections between instances of modules. Software 726 may include instructions for inputting an identification of a network or a module of the PLD. The network that is identified may be a starting network for a search for reachable pins that are functionally connected to the starting network. The module that is identified may be a switchbox module or a tile module and the identification may include a type of the module.

Software 728 may include instructions for inputting a characterization a module of the PLD that may be one or more repeater modules, multiplexer modules, logic site modules, switchbox modules, configuration memory cells, or configuration control modules. The characterization may be manually or automatically generated and include selected properties of the module, such as a type of the module and one or more ordered or unordered sets of selected pins of the module. Software 730 may input a specification of one or more representations that may be a graphical representation of the PLD or respective tile representation for the tile modules of the PLD.

Software 732 may include instructions for managing a queue of reachable pins that are functionally connected to a starting network of the netlist for the PLD. The queue may include the paths the functionally connects each pin in the queue to the starting network.

Software 734 may include instructions for searching the PLD netlist to determine various properties of the PLD. In a first embodiment, the search determines pins of a switchbox module through which the programmable connections are provided and the search also determines programmable connections of the switchbox module. In a second embodiment, the search determines connectivity pins of the tile module and modeled interconnects of a tile module. In a third embodiment, the search determines a controlling pin for each select input pin of each instance of a logic site or multiplexer module within a tile module. In a fourth embodiment, the search determines the indices of a configuration memory cell within a tile module.

Software 736 may include instructions for outputting a specification of certain properties of the PLD, such as the pins reachable from a starting network, certain programmable connections, a list of networks for modeled interconnects, the controlling pin for each select input pin, and/or the indices of a configuration memory cell within the tile module.

Software 738 may include instructions for checking for a match or correspondence between connection representations terminating at the shared portion of the boundaries of adjacent occurrences of tile representations.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable media such as magnetic or optical disks or tapes, or electronic storage devices.

The present invention is thought to be applicable to a variety of systems for modeling a programmable logic device. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A processor-implemented method for constructing a model of a programmable logic device (PLD) design, comprising:

inputting a netlist that describes the PLD design, the netlist including a plurality of instances of a plurality of modules, and the modules including a plurality of programmable tile modules and the instances including a plurality of tile instances of the programmable tile modules;

inputting an identification of each of the programmable tile modules, each programmable tile module including at least one programmable resource, each programmable resource being one of a programmable interconnect resource configurable to implement a plurality of routing arcs and a programmable logic resource configurable to implement a plurality of logic functions;

generating a first map from the netlist, the first map linking each of the routing arcs to at least one bit of configuration data for programming the programmable interconnect resources of the programmable tile modules; and generating a second map from the netlist, the second map linking each of the logic functions to at least one bit of configuration data for programming the programmable logic resources of the programmable tile modules wherein the inputting a netlist, the inputting an identification, the generating a first map, and the generating a second map are implemented on the processor.

2. The method of claim 1, further comprising:

inputting first characterization data for a plurality of sub-modules of the programmable tile modules for the programmable resources;

for each programmable tile module identified by the identification, generating from the netlist and the first characterization data, the routing arcs of each programmable interconnect resource of the programmable tile module;

inputting second characterization data for at least one configuration-memory-cell module of the PLD design; and inputting third characterization data for at least one configuration control module of the PLD design, wherein the generating of the first map includes generating the first map from the netlist and the second and third characterization data, and the generating of the second map includes generating the second map from the netlist and the second and third characterization data.

3. The method of claim 2, wherein the generating of the routing arcs of the programmable interconnect resources of the programmable tile module includes:

inputting an identification of the switchbox module, the switchbox module including at least one instance of at least one multiplexer module;

the first characterization data specifying, for each multiplexer module of the switchbox module, a plurality of input pins and at least one output pin of the multiplexer module, wherein the multiplexer module programmably connects each output pin to one of the input pins;

determining a plurality of pins of the switchbox module through which the programmable connections are provided via the at least one instance of the at least one multiplexer module of the switchbox module; and determining each pair of the plurality of pins of the switchbox module that are functionally connected via at least one instance of the at least one multiplexer module, wherein the pair of the pins specifies a programmable connection, and the pair of pins are functionally connected if the pair of pins have equal respective logical values during operation of the PLD design.

4. The method of claim 3, wherein the determining of the pins of the switchbox module through which the programmable connections are provided includes determining the pins of the switchbox module that are functionally connected to the input pins and the at least one output pin of the instances of the at least one multiplexer module.

5. The method of claim 3, wherein each of the programmable connections passes through each of the at least one instance of a multiplexer module from one of the input pins of the multiplexer module to one of the at least one output pin of the multiplexer module.

6. The method of claim 2, wherein the generating of the routing arcs of the programmable interconnect resources of the programmable tile module includes:

the first characterization data specifying a plurality of modeled pins of the at least one sub-module, wherein each sub-module is one of a logic-site module and a switchbox module, and a logic-site module provides programmable logic resources;

determining a plurality of connectivity pins of the tile module, wherein for each connectivity pin, the connectivity pin of one of the tile instances is connected in the netlist to one of the modeled pins of an instance of the at least one sub-module within one of the tile instances; and determining each of a plurality networks of the tile module, wherein each network connects a respective first subset of the connectivity pins of the tile module and a respective second subset of the modeled pins of the at least one instance of the at least one sub-module within the tile module.

7. The method of claim 6, wherein the determining of the connectivity pins includes searching the netlist from the modeled pins of each instance of the at least one sub-module within each of the tile instances of the PLD design to reachable pins that are functionally connected to the modeled pins, each reachable pin and each modeled pin being functionally connected if a logical value of the reachable pin is equal to a logical value of the modeled pin during operation of the PLD design, and determining the connectivity pins as the reachable pins that are pins of one of the tile instances.

8. The method of claim 7, wherein one of the reachable pins is functionally connected to one of the modeled pins via an instance of a repeater module that repeats a logical value from an input pin of the repeater module at an output pin of the repeater module.

9. The method of claim 8 further comprising inputting characterization data for the repeater module specifying the input and output pins.

10. The method of claim 2 further comprising:

the first characterization data specifying at least one select input pin that controls a programmable function of the sub-module, wherein each sub-module is one of a multiplexer module and a logic site module, and a logic-site module provides programmable logic resources;

the second characterization data specifies a data output pin of the configuration-memory-cell module; and the generating the first and second map includes determining the controlling pin for each select input pin of each instance of the at least one sub-module of the tile module, wherein the controlling pin for one select input pin is the data output pin of an instance of the at least one configuration-memory-cell module of the tile module.

11. The method of claim 10, wherein the controlling pin for each select input pin of each instance of the sub-modules of each programmable tile module is one of an input pin of the programmable tile module and the data output pin of an instance of the at least one configuration-memory-cell module of the programmable tile module.

12. The method of claim 10, wherein the determining of the controlling pin for each select input pin of each instance of the sub-modules of each programmable tile module includes searching the netlist from each select input pin of each instance of the sub-modules of the programmable tile module to at least one reachable pin that is functionally connected to the select input pin, each reachable pin and the select pin being functionally connected if a logical value of the reachable pin is equal to a logical value of the select input pin during operation of the PLD design, and determining the controlling pin as the reachable pin that is one of an input pin of the programmable tile module and the data output pin of an instance of the at least one configuration-memory-cell module of the programmable tile module.

13. The method of claim 12, wherein one of the at least one reachable pin for an instance of the sub-modules of the programmable tile module is functionally connected to the select input pin via an instance of a repeater module that repeats a logical value from an input pin of the repeater module at an output pin of the repeater module.

14. The method of claim 2 further comprising:
inputting a netlist that describes the PLD design, the netlist including a plurality of instances of a plurality of modules and the instances including the cell instances of the at least one configuration-memory-cell module of the tile module;
the second characterization data specifying an address input pin and a data input pin of the configuration-memory-cell module;
the third characterization data specifying a first ordered set of address output pins and a second ordered set of data output pins of the at least one configuration control module; and
the generating the first and second map includes, for each of the cell instances of the at least one configuration-memory-cell module within the tile module, determining the respective first index of an address output pin in the first ordered set and the respective second index of a data output pin in the second ordered set, wherein the address output pin is functionally connected to the address input pin of the cell instance and the data output pin is functionally connected to the data input pin of the cell instance, and a first and second pin are functionally connected if a logical value of the first pin is equal to a logical value of the second pin during operation of the PLD design.

15. The method of claim 14, wherein the determining of the respective first index for each of the cell instances includes searching the netlist from each address input pin of each instance of the at least one configuration-memory-cell module of each programmable tile module to a corresponding one of the address output pins of the at least one configuration control module, and determining the respective first index as a position in the first ordered set of the reachable pin.

16. The method of claim 15, wherein the corresponding one of the address output pins is a reachable pin that is functionally connected to the address input pin via an instance of a repeater module that repeats a logical value from an input pin of the repeater module at an output pin of the repeater module.

17. The method of claim 16, further comprising inputting characterization data for the repeater module that specifies a type of the repeater module and the input and output pins.

18. The method of claim 14, wherein the determining of the respective second index for each of the cell instances includes searching the netlist from each data input pin of each instance of the at least one configuration-memory-cell module of each programmable tile module to a corresponding one of the data output pins of the at least one configuration control module, and determining the respective second index as a position in the second ordered set of the reachable pin.

19. The method of claim 18, wherein the corresponding one of the data output pins is a reachable pin that is functionally connected to the data input pin via an instance of a repeater module that repeats a logical value from an input pin of the repeater module at an output pin of the repeater module.

20. A program storage medium, comprising:
a processor-readable device configured with instructions for constructing a model of a programmable logic device (PLD) design, wherein execution of the instructions by one or more processors causes the one or more processors to perform operations including,
inputting a netlist that describes the PLD design, the netlist including a plurality of instances of a plurality of modules, and the modules including a plurality of programmable tile modules and the instances including a plurality of tile instances of the programmable tile modules;
inputting an identification of each of the programmable tile modules, each programmable tile module including at least one programmable resource, each programmable resource being one of a programmable interconnect resource configurable to implement a plurality of routing arcs and a programmable logic resource configurable to implement a plurality of logic functions;
inputting first characterization data for a plurality of sub-modules of the programmable tile modules for the programmable resources;
for each programmable tile module identified by the identification, generating from the netlist and the first characterization data the routing arcs of each programmable interconnect resource of the programmable tile module;
inputting second characterization data for at least one configuration-memory-cell module of the PLD design;
inputting third characterization data for at least one configuration control module of the PLD design; and
generating a first map from the netlist and the second and third characterization data, the first map linking each routing arc to at least one bit of configuration data for programming the programmable interconnect resources of the programmable tile modules; and
generating a second map from the netlist and the second and third characterization data, the second map linking each logic function to at least one bit of configuration data for programming the programmable logic resources of the programmable tile modules.

* * * * *